US011313911B2

(12) United States Patent
Kataoka et al.

(10) Patent No.: US 11,313,911 B2
(45) Date of Patent: Apr. 26, 2022

(54) SECONDARY BATTERY PARAMETER ESTIMATION DEVICE, SECONDARY BATTERY PARAMETER ESTIMATION METHOD, AND PROGRAM

(71) Applicant: SUMITOMO ELECTRIC INDUSTRIES, LTD., Osaka (JP)

(72) Inventors: Tomomi Kataoka, Osaka (JP); Hiroaki Takechi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/254,615

(22) PCT Filed: Mar. 19, 2019

(86) PCT No.: PCT/JP2019/011303
§ 371 (c)(1),
(2) Date: Dec. 21, 2020

(87) PCT Pub. No.: WO2020/012720
PCT Pub. Date: Jan. 16, 2020

(65) Prior Publication Data
US 2021/0123980 A1    Apr. 29, 2021

(30) Foreign Application Priority Data
Jul. 10, 2018 (JP) .............................. JP2018-130979

(51) Int. Cl.
*G01R 31/367* (2019.01)
*G01R 31/374* (2019.01)
(Continued)

(52) U.S. Cl.
CPC ......... *G01R 31/367* (2019.01); *G01R 31/374* (2019.01); *G01R 31/389* (2019.01);
(Continued)

(58) Field of Classification Search
CPC .............. G01R 31/367; G01R 31/389; G01R 31/3842; G01R 31/374; G01R 31/3648
See application file for complete search history.

(56) References Cited

U.S. PATENT DOCUMENTS

2012/0004875 A1    1/2012  Maeda et al.
2012/0274285 A1*  11/2012  Chawla ................. H01M 10/44
                                               320/127
2013/0169281 A1    7/2013  Baba et al.

FOREIGN PATENT DOCUMENTS

JP    2012-013554 A    1/2012
JP    2012-058089 A    3/2012
(Continued)

OTHER PUBLICATIONS

Mathew et al., "Comparative Analysis of Lithium-Ion Battery Resistance Estimation Techniques for Battery Management Systems" Energies 2018, 11, 1490 (Year: 2018).*
(Continued)

*Primary Examiner* — John C Kuan
(74) *Attorney, Agent, or Firm* — Oliff PLC

(57) ABSTRACT

A parameter estimation device includes: a voltage acquisition unit; a current acquisition unit; a parameter estimation unit; an internal resistance deriving unit; and a determination unit configured to determine, on the basis of a result of comparison between the internal resistance estimated by the parameter estimation unit and the internal resistance derived by the internal resistance deriving unit, whether or not to replace parameters of the secondary battery with the plurality of parameters estimated by the parameter estimation unit.

9 Claims, 16 Drawing Sheets

(51) Int. Cl.
  *G01R 31/3842* (2019.01)
  *G01R 31/389* (2019.01)
  *H01M 10/48* (2006.01)
  *G01R 31/36* (2020.01)

(52) U.S. Cl.
  CPC ...... *G01R 31/3842* (2019.01); *H01M 10/486* (2013.01); *G01R 31/3648* (2013.01)

(56) References Cited

FOREIGN PATENT DOCUMENTS

| JP | 2017161490 A | * | 9/2017 | ......... G01R 31/3648 |
| JP | 2017-203659 A | | 11/2017 | |

OTHER PUBLICATIONS

Shen et al., "The Co-estimation of State of Charge, State of Health, and State of Function for Lithium-Ion Batteries in Electric Vehicles" IEEE Transactions on Vehicular Technology, vol. 67, No. 1, Jan. 2018 (Year: 2018).*

Adachi et al; "Battery Management System Engineering;" Tokyo Denki University Press; Chapter 6.2.2; Dec. 10, 2015.

\* cited by examiner

FIG. 9

| | SOC | OCV | CURRENT i | Ra TRUE VALUE | i×Ra TRUE VALUE | uL MEASUREMENT VALUE | i×Ra ALLOWABLE RANGE | Ra ALLOWABLE RANGE | Ra ALLOWABLE RATIO |
|---|---|---|---|---|---|---|---|---|---|
| SOC ALLOWABLE UPPER LIMIT (+2%) | 52% | 3.705V | 10A | — | — | 3.8V | 0.095V | 0.0095Ω | −5% |
| SOC TRUE VALUE | 50% | 3.7V | 10A | 0.01Ω | 0.1V | 3.8V | — | — | — |
| SOC ALLOWABLE LOWER LIMIT (−2%) | 48% | 3.695V | 10A | — | — | 3.8V | 0.105V | 0.0105Ω | +5% |

FIG. 15

| TEMPERATURE | STATE OF CHARGE (SOC) | | | | |
|---|---|---|---|---|---|
| | 100% | 90% | ... | 50% | |
| -10°C | 4.5 | 5.0 | | 6.0 | ... |
| 0°C | 2.5 | 3.0 | | 4.0 | |
| 10°C | 1.0 | 1.5 | | 2.0 | |
| 25°C | 0.4 | 0.5 | | 1.0 | |
| ... | | | | | |

SECONDARY BATTERY PARAMETER ESTIMATION DEVICE, SECONDARY BATTERY PARAMETER ESTIMATION METHOD, AND PROGRAM

TECHNICAL FIELD

The present invention relates to a secondary battery parameter estimation device, a secondary battery parameter estimation method, and a program.

This application claims priority on Japanese Patent Application No. 2018-130979 filed on Jul. 10, 2018, the entire content of which is incorporated herein by reference.

BACKGROUND ART

In recent years, vehicles such as hybrid electric vehicles (HEVs) and electric vehicles (EVs) are becoming prevalent. HEVs and EVs are equipped with secondary batteries. The HEV drives a motor by using power stored in the secondary battery, to drive the vehicle or perform engine assist. Thus, in the HEV, switching between charging and discharging of the secondary battery is frequently repeated in association with traveling.

Overdischarging or overcharging causes deterioration of the secondary battery. Thus, it is necessary to control charging and discharging while grasping the state of charge of the secondary battery. In addition, in order to determine deterioration of the secondary battery, it is necessary to accurately grasp the internal resistance of the secondary battery. Parameters such as internal resistance of the secondary battery vary in accordance with the operation state of the vehicle, and thus, the parameters need to be estimated in predetermined cycles. The estimated parameters are stored every time the estimation is performed, and are used in control of the vehicle or the secondary battery.

For example, PATENT LITERATURE 1 describes a parameter estimation device including an equivalent circuit model corresponding to the secondary battery in order to estimate parameters such as internal resistance of the secondary battery. The parameter estimation device of PATENT LITERATURE 1 inputs, to the equivalent circuit model, a value obtained by differentiating the voltage between terminals of the secondary battery and the value of a charge/discharge current outputted by the secondary battery, thereby estimating a parameter of the secondary battery.

CITATION LIST

Patent Literature

PATENT LITERATURE 1: Japanese Laid-Open Patent Publication No. 2012-58089

SUMMARY OF INVENTION

A parameter estimation device according to one mode of the present disclosure includes: a voltage acquisition unit configured to acquire a voltage of a secondary battery; a current acquisition unit configured to acquire a current of the secondary battery; a parameter estimation unit configured to estimate a plurality of parameters including an internal resistance of the secondary battery in an equivalent circuit model corresponding to the secondary battery, on the basis of the voltage acquired by the voltage acquisition unit and the current acquired by the current acquisition unit; an internal resistance deriving unit configured to derive an internal resistance of the secondary battery by a method different from a method for the estimation performed by the parameter estimation unit; and a determination unit configured to determine, on the basis of a result of comparison between the internal resistance estimated by the parameter estimation unit and the internal resistance derived by the internal resistance deriving unit, whether or not to replace parameters of the secondary battery with the plurality of parameters estimated by the parameter estimation unit.

A secondary battery parameter estimation method according to one mode of the present disclosure includes: acquiring a voltage and a current of a secondary battery; estimating, on the basis of the voltage and the current that have been acquired, a plurality of parameters including an internal resistance of the secondary battery in an equivalent circuit model corresponding to the secondary battery; deriving an internal resistance of the secondary battery by a method different from that for the estimation of the parameters; and determining, on the basis of a result of comparison between the internal resistance included in the plurality of parameters estimated and the internal resistance derived by the different method, whether or not to replace parameters of the secondary battery with the plurality of parameters estimated.

A program according to one mode of the present disclosure is configured to cause a computer to execute processes of: acquiring a voltage and a current of a secondary battery; estimating, on the basis of the voltage and the current that have been acquired, a plurality of parameters including an internal resistance of the secondary battery in an equivalent circuit model corresponding to the secondary battery; deriving an internal resistance of the secondary battery by a method different from that for the estimation of the parameters; and determining, on the basis of a result of comparison between the internal resistance included in the plurality of parameters estimated and the internal resistance derived by the different method, whether or not to replace parameters of the secondary battery with the plurality of parameters estimated.

BRIEF DESCRIPTION OF DRAWINGS

FIG. 9 is an illustration regarding error ratio in a predetermined range.

FIG. 15 illustrates conversion ratio of internal resistance based on state of charge and temperature.

DESCRIPTION OF EMBODIMENTS

Figure 1:
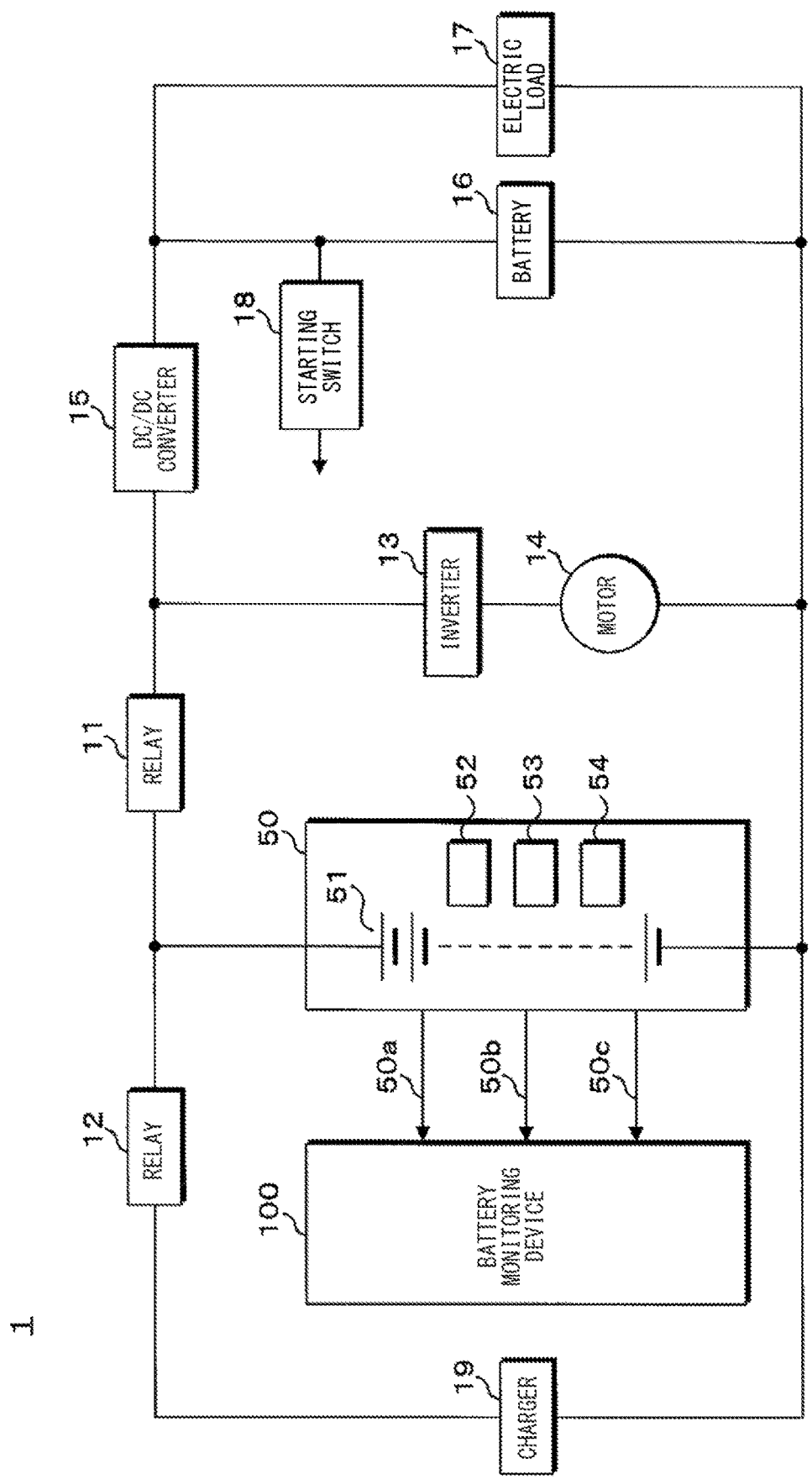
FIG. 1 is a block diagram showing an example of a configuration of a main part of a vehicle equipped with a battery monitoring device as a secondary battery parameter estimation device of Embodiment 1.

Problems to be Solved by the Present Disclosure

Action in the secondary battery occurs through complicated chemical reactions. Thus, in the equivalent circuit model, it could be difficult to secure the accuracy of estimated parameters.

An object of the present disclosure is to provide a secondary battery parameter estimation device that can determine the accuracy of parameters of the secondary battery estimated by using an equivalent circuit model.

Effects of the Present Disclosure

According to one mode of the present disclosure, the accuracy of parameters of the secondary battery estimated by using an equivalent circuit model can be determined.

Description of Embodiment of the Present Disclosure

First, embodiments of the present disclosure are listed and described below. At least some parts of the embodiments described below can be combined as desired.

(1) A parameter estimation device according to one mode of the present disclosure includes: a voltage acquisition unit configured to acquire a voltage of a secondary battery; a current acquisition unit configured to acquire a current of the secondary battery; a parameter estimation unit configured to estimate a plurality of parameters including an internal resistance of the secondary battery in an equivalent circuit model corresponding to the secondary battery, on the basis of the voltage acquired by the voltage acquisition unit and the current acquired by the current acquisition unit; an internal resistance deriving unit configured to derive an internal resistance of the secondary battery by a method different from a method for the estimation performed by the parameter estimation unit; and a determination unit configured to determine, on the basis of a result of comparison between the internal resistance estimated by the parameter estimation unit and the internal resistance derived by the internal resistance deriving unit, whether or not to replace parameters of the secondary battery with the plurality of parameters estimated by the parameter estimation unit.

In the present mode, through comparison between the internal resistance estimated by the parameter estimation unit and the internal resistance derived by a method different from a method for the estimation performed by the parameter estimation unit, the accuracy of the parameters of the secondary battery estimated by using the equivalent circuit model can be determined, and whether or not to replace the parameters of the secondary battery with the plurality of parameters estimated by the parameter estimation unit, can be determined.

(2) Preferably, the parameter estimation device includes a switching determination unit configured to determine whether or not switching between charging and discharging of the secondary battery has occurred, and when the switching determination unit has determined that the switching has occurred, the internal resistance deriving unit derives the internal resistance of the secondary battery on the basis of a voltage acquired by the voltage acquisition unit and a current acquired by the current acquisition unit after a predetermined standby time.

In the present mode, when the switching determination unit has determined that the switching has occurred, the internal resistance deriving unit derives the internal resistance of the secondary battery on the basis of a voltage acquired by the voltage acquisition unit and a current acquired by the current acquisition unit after a predetermined standby time. Thus, the internal resistance can be accurately derived. Therefore, through comparison with the internal resistance derived by the internal resistance deriving unit according to a method different from that used by the parameter estimation unit, the accuracy of the parameters of the secondary battery estimated by using the equivalent circuit model can be determined.

(3) Preferably, the internal resistance deriving unit derives the internal resistance of the secondary battery on the basis of at least one of a full charge capacity, a state of charge, and a temperature of the secondary battery.

In the present mode, the internal resistance deriving unit derives the internal resistance of the secondary battery on the basis of at least one of a full charge capacity, a state of charge, and a temperature of the secondary battery. Therefore, through comparison with the internal resistance derived by the internal resistance deriving unit according to a method different from that used by the parameter estimation unit, the accuracy of the parameters of the secondary battery estimated by using the equivalent circuit model can be determined.

(4) Preferably, when a ratio between the internal resistance derived by the internal resistance deriving unit and the internal resistance estimated by the parameter estimation unit is in a predetermined range, the determination unit determines to replace the parameters of the secondary battery with the plurality of parameters estimated by the parameter estimation unit.

In the present mode, when the ratio between the internal resistance derived by the internal resistance deriving unit and the internal resistance estimated by the parameter estimation unit is in a predetermined range, replacement as to the battery state quantity of the secondary battery is determined. Thus, it is possible to determine the accuracy of the parameters of the secondary battery by a simple method, to replace the parameters of the secondary battery.

(5) Preferably, the predetermined range is determined in accordance with a required accuracy for a state of charge of the secondary battery derived on the basis of the plurality of parameters estimated by the parameter estimation unit.

In the present mode, the predetermined range is determined on the basis of the required accuracy for the state of charge of the secondary battery derived on the basis of the parameters estimated by using the equivalent circuit model. Thus, it is possible to determine the accuracy of the parameters of the secondary battery such that the accuracy is appropriate for deriving the state of charge of the secondary battery, to replace the parameters of the secondary battery.

(6) Preferably, the parameter estimation unit estimates the plurality of parameters including the internal resistance of the secondary battery a plurality of times, the internal resistance deriving unit derives the internal resistance of the secondary battery a plurality of times, and the determination unit determines whether or not to replace the parameters of the secondary battery with the plurality of parameters estimated by the parameter estimation unit, on the basis of a result of comparison between each internal resistance derived by the internal resistance deriving unit and each internal resistance estimated by the parameter estimation unit corresponding to each time point at which the internal resistance has been derived by the internal resistance deriving unit.

In the present mode, the parameter estimation unit estimates the plurality of parameters including the internal resistance of the secondary battery a plurality of times, and the internal resistance deriving unit derives the internal resistance of the secondary battery a plurality of times. On the basis of a plurality of results of comparisons between the respective derived internal resistances and the respective estimated internal resistances, the determination unit determines whether or not to perform replacement as to the battery state quantity of the secondary battery. Thus, the accuracy of the parameters of the secondary battery can be determined with the reliability of the results of comparisons improved, and the parameters of the secondary battery can be replaced.

(7) Preferably, when a ratio between the internal resistance derived by the internal resistance deriving unit and the internal resistance estimated by the parameter estimation unit is in a predetermined range not less than a predetermined number of times consecutively in the results of comparisons, the determination unit determines to replace the parameters of the secondary battery with the plurality of parameters estimated by the parameter estimation unit.

In the present mode, when the ratio between the internal resistance derived by the internal resistance deriving unit and the internal resistance estimated by the parameter estimation unit is in a predetermined range not less than a predetermined number of times consecutively in the results of comparisons, the determination unit determines to perform replacement as to the battery state quantity of the secondary battery. Thus, the accuracy of the parameters of the secondary battery can be determined with the reliability of the results of comparisons improved, and the parameters of the secondary battery can be replaced.

(8) Preferably, a battery state quantity of the secondary battery includes the plurality of parameters estimated by the parameter estimation unit, and the determination unit determines whether or not to perform replacement with the plurality of parameters estimated by the parameter estimation unit, as the battery state quantity of the secondary battery.

In the present mode, the determination unit determines whether or not to perform replacement with the plurality of parameters estimated, as the battery state quantity of the secondary battery. Thus, the battery state quantity of the secondary battery can be appropriately replaced.

(9) A parameter estimation method according to one mode of the present disclosure includes: acquiring a voltage and a current of a secondary battery; estimating, on the basis of the voltage and the current that have been acquired, a plurality of parameters including an internal resistance of the secondary battery in an equivalent circuit model corresponding to the secondary battery; deriving an internal resistance of the secondary battery by a method different from that for the estimation of the parameters; and determining, on the basis of a result of comparison between the internal resistance included in the plurality of parameters estimated and the internal resistance derived by the different method, whether or not to replace parameters of the secondary battery with the plurality of parameters estimated.

In the present mode, provided is a parameter estimation method in which the accuracy of estimated parameters of a secondary battery is determined.

(10) A program according to one mode of the present disclosure is configured to cause a computer to execute processes of: acquiring a voltage and a current of a secondary battery; estimating, on the basis of the voltage and the current that have been acquired, a plurality of parameters including an internal resistance of the secondary battery in an equivalent circuit model corresponding to the secondary battery; acquiring an internal resistance of the secondary battery derived by a method different from that for the estimation of the parameters; and determining, on the basis of a result of comparison between the internal resistance included in the plurality of parameters estimated and the internal resistance derived by the different method, whether or not to replace parameters of the secondary battery with the plurality of parameters estimated.

In the present mode, it is possible to cause a computer to function as a parameter estimation device for a secondary battery.

Details of Embodiment of the Present Disclosure

Hereinafter, a specific example in which a secondary battery parameter estimation device of the present embodiment is applied to a battery monitoring device 100 which monitors the state of the secondary battery unit 50 is described in detail. The present disclosure is not limited to these examples but is defined by the claims, and is intended to include meaning equivalent to the scope of the claims and all modifications within the scope. The technological features described in embodiments can be combined with each other.

Embodiment 1

FIG. 1 is a block diagram showing an example of a configuration of a main part of a vehicle 1 equipped with the battery monitoring device 100 serving as the secondary battery parameter estimation device of Embodiment 1. The vehicle 1 includes the battery monitoring device 100, the secondary battery unit 50, relays 11, 12, an inverter 13, a motor 14, a DC/DC converter 15, a battery 16, an electric load 17, a starting switch 18, and a charger 19.

The secondary battery unit (secondary battery) 50 is, for example, a lithium ion battery, and in the secondary battery unit 50, a plurality of cells (unit cells) 51 are connected in series or series-parallel. The secondary battery unit 50 is provided with a voltage sensor 52, a current sensor 53, and a temperature sensor 54.

The voltage sensor 52 detects the voltage of each cell 51 and the voltage between both ends of the secondary battery unit 50, and outputs the detected voltages via a voltage detection line 50a to the battery monitoring device 100. The current sensor 53 is composed of, for example, a shunt resistor or a Hall sensor, and detects the charge current and the discharge current (charge/discharge current) of the secondary battery unit 50. The current sensor 53 outputs the detected current via a current detection line 50b to the battery monitoring device 100. The temperature sensor 54 is composed of, for example, a thermistor, and detects the temperature of each cell 51. The temperature sensor 54 outputs the detected temperature via a temperature detection line 50c to the battery monitoring device 100.

On/Off control of the relays 11, 12 is performed by a relay control unit (not shown). The inverter 13 controls current application to the motor 14 on the basis of a command from a vehicle controller (not shown). The charger 19 receives power from a power supply outside the vehicle while the vehicle 1 is stopped, and charges the secondary battery unit 50.

The battery 16 is, for example, a lead battery, supplies power to the electric load 17 of the vehicle 1, and is charged by the secondary battery unit 50 via the DC/DC converter 15 when the relay 11 is on. The battery 16 is not limited to the lead battery.

The starting switch 18 is a switch related to charging/discharging operation of the secondary battery unit 50. A signal indicating On/Off is outputted to the battery monitoring device 100. For example, when the battery monitoring device 100 is not operating when the state of the starting switch 18 is switched from Off to On, the battery monitoring device 100 is started.

Figure 2:
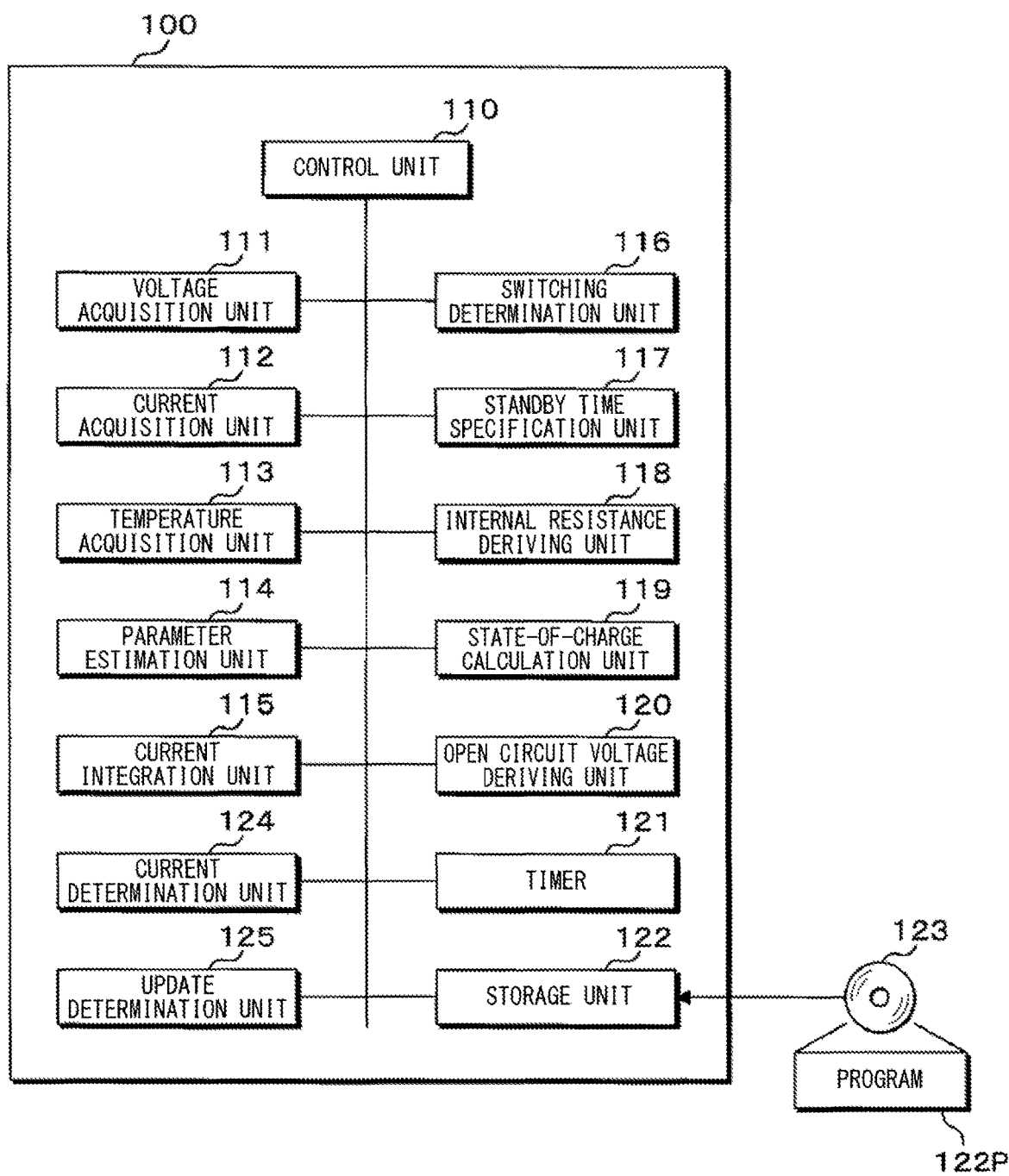
FIG. 2 is a block diagram showing an example of a functional configuration of the battery monitoring device.

FIG. 2 is a block diagram showing an example of a functional configuration of the battery monitoring device 100. The battery monitoring device 100 includes a control unit 110 which controls the entire device, a voltage acquisition unit 111, a current acquisition unit 112, a temperature acquisition unit 113, a parameter estimation unit 114, a current integration unit 115, a switching determination unit 116, a standby time specification unit 117, an internal resistance deriving unit 118, a state-of-charge calculation unit 119, an open circuit voltage deriving unit 120, a timer 121, a storage unit 122, a current determination unit 124, and an update determination unit 125. The voltage acquisition unit 111, the current acquisition unit 112, the temperature acquisition unit 113, the parameter estimation unit 114, the current integration unit 115, the switching determination unit 116, the standby time specification unit 117, the internal resistance deriving unit 118, the state-of-charge calculation unit 119, the open circuit voltage deriving unit 120, the current determination unit 124, and the update determination unit 125 are each a function unit realized by software processing executed by the control unit 110 using hardware. Alternatively, a part or the entirety of these functions may be realized by an integrated circuit including a microcomputer.

The control unit 110 includes a CPU (Central Processing Unit). The control unit 110 has connected thereto: the timer 121 which counts time; and the storage unit 122 using a nonvolatile memory such as a flash memory, an EPROM (Erasable Programmable Read Only Memory), or an EEPROM (Electrically EPROM: registered trade mark), and a rewritable memory such as a DRAM (Dynamic Random Access Memory) or an SRAM (Static Random Access Memory). The control unit 110 reads out and executes a program 122P and data stored in the storage unit 122, thereby performing various control processes, arithmetic processing, and the like. As shown in FIG. 2, the program 122P stored in the storage unit 122 may be the program 122P read out from a storage medium 123 readable by the battery monitoring device 100. Alternatively, the program 122P may be acquired and stored from an external server (not shown) communicably connected to the battery monitoring device 100.

The voltage acquisition unit 111 acquires the voltage of each of the plurality of cells 51 and the voltage of the secondary battery unit 50, in a time-series manner. The current acquisition unit 112 acquires the current (charge current and discharge current (charge/discharge current)) of the secondary battery unit 50 in a time-series manner. The sampling cycle of acquiring the voltage and the current can be controlled by the control unit 110. The sampling cycle may be 10 ms, for example, but is not limited thereto. The temperature acquisition unit 113 acquires the temperature of each cell 51.

The parameter estimation unit 114 estimates the values of a resistor (Ra), a resistor (Rb), and a capacitor (Cb) which are parameters included in an equivalent circuit model (see FIG. 8) of the secondary battery unit 50 described later. These parameters vary in accordance with the state of charge (SOC), the temperature, the state of health, or the like of the secondary battery unit 50, and can be sequentially estimated by acquiring the voltage and the charge/discharge current of the secondary battery unit 50 in a time-series manner. Details thereof will be described in the description of an equivalent circuit model. The parameters (Ra, Rb, Cb) estimated by the parameter estimation unit 114 are stored in the storage unit 122. Parameters (Ra, Rb, Cb) with which update (replacement) is determined by an update determination unit described later are stored or replaced by being updated in the storage unit 122, as a battery state quantity of the secondary battery unit 50, and the battery state quantity is used in various controls of the secondary battery unit 50, such as deriving the state of charge SOC, for example.

The current integration unit 115 integrates the current (charge/discharge current) acquired by the current acquisition unit 112. The integrated value of current is obtained by integrating the current over time and corresponds to an amount of change in the charge amount. The timing when integration is started is the timing when the secondary battery unit 50 or the battery monitoring device 100 itself is started, and the current integration unit 115 continuously calculates the integrated value. The integrated value may be reset at a predetermined timing.

The switching determination unit 116 determines whether or not switching between charging and discharging of the secondary battery unit 50 has occurred, on the basis of the current acquired by the current acquisition unit 112. For example, in a case where the current acquired by the current acquisition unit 112 in the case of charging is defined as positive, if the current acquired by the current acquisition unit 112 is negative, it is possible to determine that discharging has occurred, because the directions of the current are opposite between charging and discharging. That is, when one of charging or discharging is defined as positive, if the current has become negative or 0 from positive, if the current has become positive or negative from 0, or if the current has become positive or 0 from negative, it is possible to determine that switching between charging and discharging has occurred.

The standby time specification unit 117 specifies, using an impedance spectrum of the secondary battery unit 50, a standby time on the basis of a boundary frequency range in which the diffusion impedance resulting from the diffusion process of predetermined ions contributes to the impedance of the secondary battery unit 50. The impedance spectrum is also referred to as Cole-Cole plot or Nyquist plot, and is a plot of values obtained by measuring the impedance of the secondary battery unit 50 at a plurality of frequencies by using an AC impedance method. The predetermined ions are lithium (Li) ions. Here, boundary frequency range refers to providing a necessary width of the frequencies, and refers to not being limited to a frequency at a point.

Figure 3:
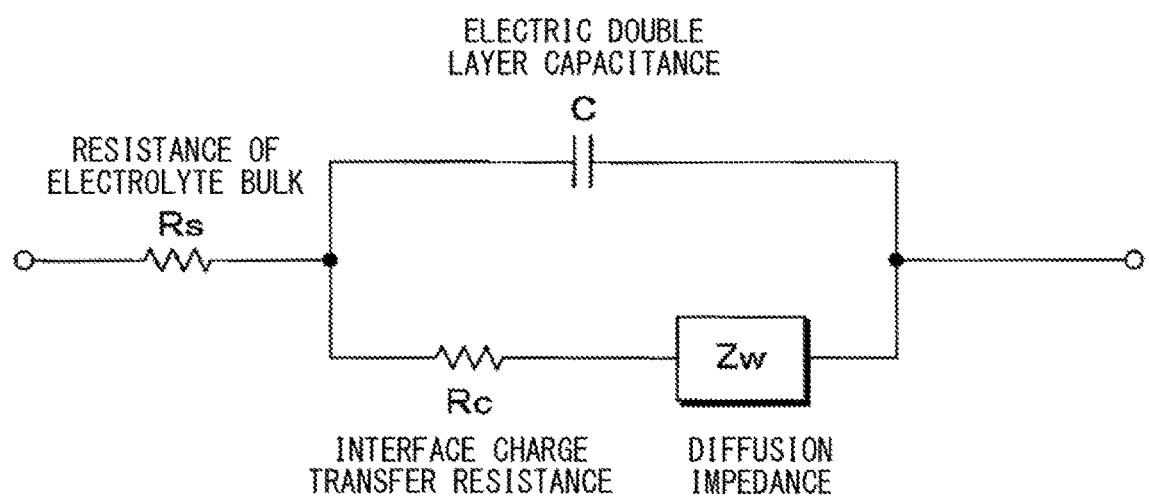
FIG. 3 illustrates an equivalent circuit model of the secondary battery unit applied in an internal resistance deriving unit.

FIG. 3 illustrates an equivalent circuit model of the secondary battery unit 50 applied in the internal resistance deriving unit 118 described later. The secondary battery unit 50 can be represented by an equivalent circuit model composed of a resistance Rs of an electrolyte bulk, an interface charge transfer resistance Rc, an electric double layer capacitance C (capacitance), and a diffusion resistance (diffusion impedance) Zw. The resistance of the electrolyte bulk includes the conduction resistance of lithium (Li) ions in an electrolyte, the electron resistance at positive and negative electrodes, etc. The interface charge transfer resistance includes the charge transfer resistance and the film resistance on an active material surface, etc. The diffusion impedance is an impedance resulting from a diffusion process of lithium (Li) ions into active material particles.

Figure 4:
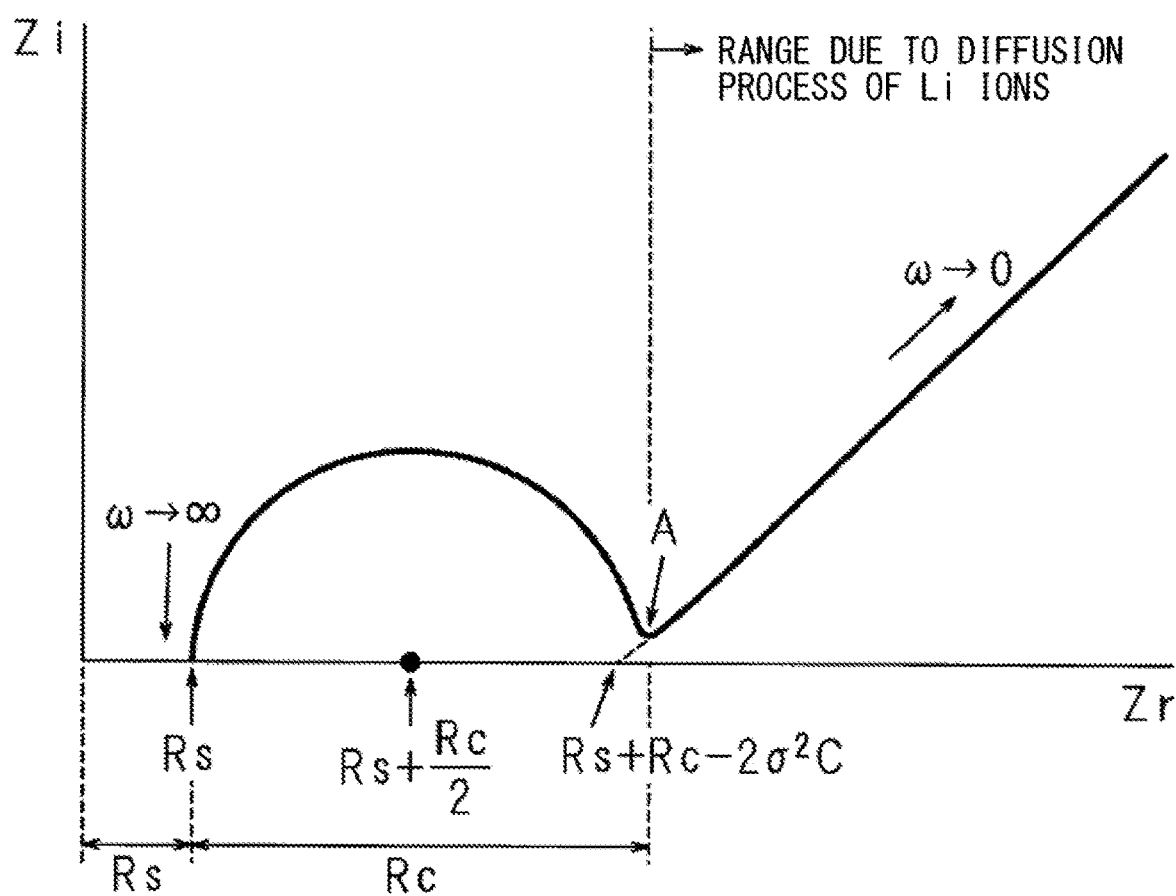
FIG. 4 illustrates an example of an impedance spectrum (Cole-Cole plot) of the secondary battery unit.

FIG. 4 illustrates an example of an impedance spectrum (Cole-Cole plot) of the secondary battery unit 50. In FIG. 4, the horizontal axis represents the real number component Zr of an impedance Z, and the vertical axis represents the imaginary number component Zi of the impedance Z. The internal resistance of the secondary battery unit 50 is mainly composed of the resistance of the electrolyte bulk and the interface charge transfer resistance in a case of usage where charging and discharging are frequently switched. When the frequency in the AC impedance method is changed from a high frequency to a low frequency, in a certain frequency range (referred to as a boundary frequency range) as shown in FIG. 4, the diffusion impedance increases and the impedance of the secondary battery unit 50 increases (contributes to the impedance of the secondary battery unit 50). Thus, it is possible to say that the impedance in the boundary frequency range before increase of the diffusion impedance represents the internal resistance not including the diffusion resistance of the secondary battery unit 50, and the boundary frequency range means such frequencies in which the influence by the diffusion impedance is small or negligible.

The frequency f in the AC impedance method and a standby time T from application of a direct current to measurement have a relationship of $T=1/(2\times f)$. That is, the standby time T can be specified from, for example, the relationship of the reciprocal of twice the frequency f. For example, when the frequency f is 5 Hz, the standby time T is 0.1 seconds. Setting the standby time T to the reciprocal of twice the frequency f is an example, and, for example, the standby time T may be set to the reciprocal of four times the frequency f.

The standby time specification unit 117 may specify the standby time on the basis of a state of charge (SOC) described later. When the state of charge is smaller, the boundary frequency becomes lower, and the standby time T inversely proportional to the frequency f in the boundary frequency range becomes longer. The standby time specification unit 117 may specify the standby time T on the basis of the temperature acquired by the temperature acquisition unit 113. When the temperature of the secondary battery unit 50 is lower, the boundary frequency becomes lower, and the standby time T inversely proportional to the frequency f in the boundary frequency range becomes longer. The standby time specification unit 117 may specify the standby time T on the basis of the deterioration of the secondary battery unit 50. When deterioration of the secondary battery unit 50 advances, the boundary frequency becomes lower, and the standby time T inversely proportional to the frequency f in the boundary frequency range becomes longer. The state of health (SOH) of the secondary battery unit 50 is calculated on the basis of the proportion of an internal resistance R1 calculated by the internal resistance deriving unit 118 described later to an initial value R0 of the internal resistance of the secondary battery unit 50.

When the switching determination unit 116 has determined that switching between charging and discharging has occurred, the internal resistance deriving unit 118 calculates an internal resistance R1 of the secondary battery unit 50 on the basis of the voltage acquired by the voltage acquisition unit 111 and the current acquired by the current acquisition unit 112 after the standby time T specified by the standby time specification unit 117. The calculated internal resistance R1 is stored into the storage unit 122.

Figure 5:
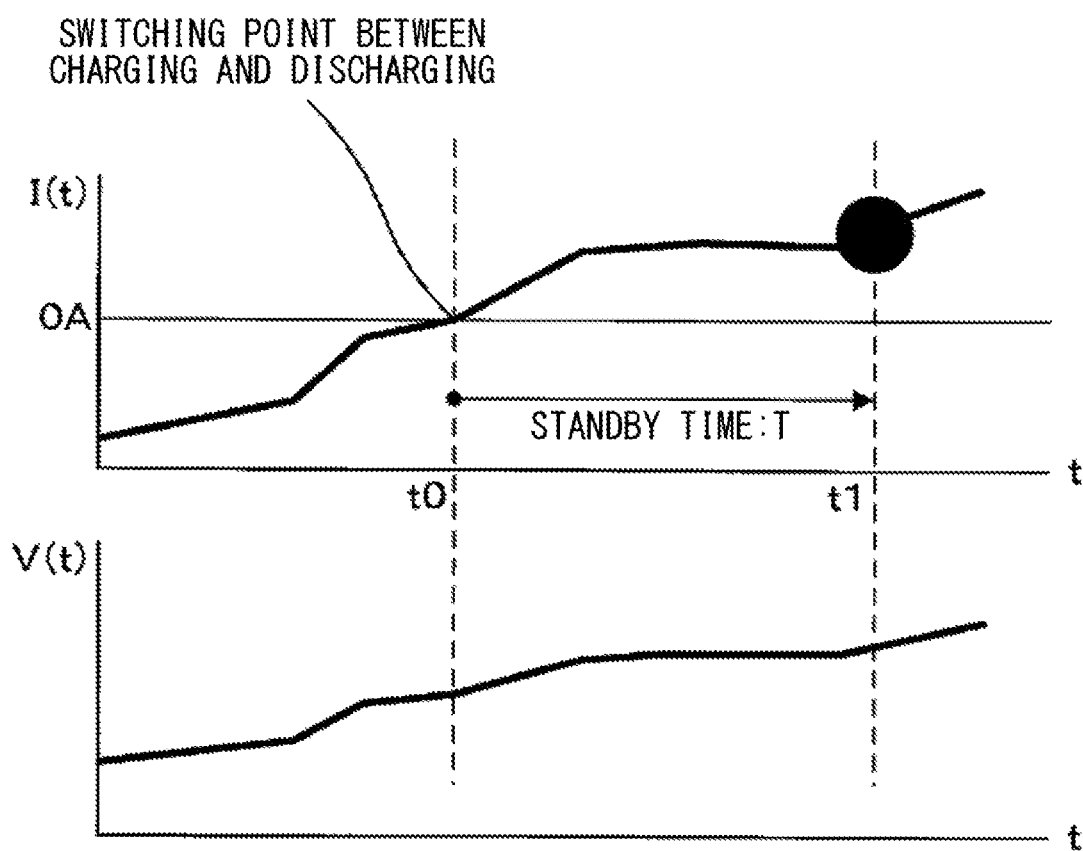
FIG. 5 illustrates temporal transitions of current and voltage before and after switching between charging and discharging of the secondary battery unit.

FIG. 5 illustrates temporal transitions of current and voltage before and after switching between charging and discharging of the secondary battery unit 50. In FIG. 5, the horizontal axis represents time, the vertical axis in the upper diagram represents current, and the vertical axis in the lower diagram represents voltage. A positive value of the current represents charging and a negative value of the current represents discharging.

When switching has occurred from charging to discharging or from discharging to charging, the diffusion resistance (diffusion impedance) and the charge transfer resistance of the secondary battery unit 50 are reset once, and the diffusion resistance and the charge transfer resistance start to increase in accordance with the current application time period. Thus, in a case where switching between charging and discharging has been determined to have occurred, the internal resistance R1 of the secondary battery unit 50 can be calculated by acquiring a voltage V(t1) and current I(t1) at the time point when the standby time T ends. Accordingly, the internal resistance R1 can be obtained in a short time (for example, about 0.1 seconds) after the switching between charging and discharging has occurred. Thus, even when charging and discharging are frequently repeated, the internal resistance R1 of the secondary battery unit 50 can be accurately calculated in a relatively short time after the switching between charging and discharging has occurred.

The internal resistance deriving unit 118 calculates the internal resistance R1 of the secondary battery unit 50 on the basis of a voltage V(t0) acquired by the voltage acquisition unit 111 and a current W0) acquired by the current acquisition unit 112 at the time point when or immediately before the switching determination unit 116 has determined that switching between charging and discharging has occurred, and on the basis of a voltage V(t1) acquired by the voltage acquisition unit 111 and a current I(t1) acquired by the current acquisition unit 112 after the standby time T specified by the standby time specification unit 117.

The absolute value of the slope of the straight line obtained from the voltage and the current between two points indicates the internal resistance R1 of the secondary battery unit 50. Therefore, the internal resistance R1 can be derived as $R1=(V(t1)-V(t0))/(I(t1)-I(t0))$. The derived internal resistance R1 is stored in the storage unit 122, and can be used for deriving the state of health (SOH) of the secondary battery unit 50, for example. The internal resistance deriving unit 118 may derive the internal resistance R1 of the secondary battery unit 50 when the absolute value of the current acquired by the current acquisition unit 112 after the standby time T specified by the standby time specification unit 117 is greater than a predetermined threshold. When the absolute value of the current acquired after a lapse of the standby time T is small, the internal resistance R1 cannot be accurately derived. Thus, by adding a condition that "when the absolute value of the current is greater than a predetermined threshold", it is possible to increase the accuracy of deriving the internal resistance R1.

Figure 6:
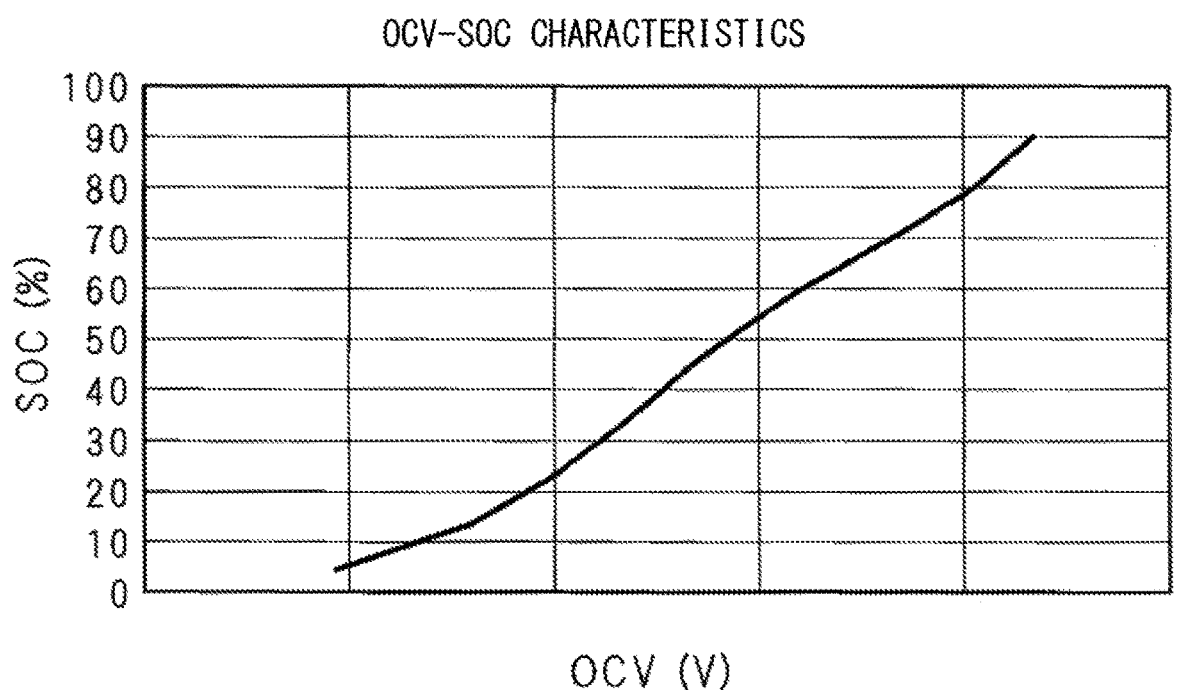
FIG. 6 is a graph showing the correspondence (OCV-SOC characteristics) between open circuit voltage and state of charge of the secondary battery unit.

FIG. 6 is a graph showing the correspondence (OCV-SOC characteristics) between open circuit voltage and state of charge of the secondary battery unit 50. The horizontal axis represents open circuit voltage (OCV), and the vertical axis represents state of charge (SOC). As shown in FIG. 6, the greater the open circuit voltage of the secondary battery unit 50 is, the greater the state of charge is. The correlation between the open circuit voltage and the state of charge shown as an example in FIG. 6 may be stored in the storage unit 122 in the form of a conversion table, etc., or may be calculated by an arithmetic circuit.

The state-of-charge calculation unit 119 calculates a state of charge SOCo at the present time point on the basis of the integrated value calculated by the current integration unit 115 and the full charge capacity (FCC) of the secondary battery unit 50. The state of charge is represented as a ratio of the charge amount to the full charge capacity. When the initial value of the state of charge is defined as SOCin, the state of charge SOCo at the present time point is calculated by adding, to SOCin, a value obtained by converting, into a state of charge, an integrated value calculated by the current integration unit 115 during a time period from when SOCin has been calculated to the present time point. In a case where SOCin as the initial value of the state of charge has not been calculated, SOCin may be derived while using, as the open circuit voltage (OCV), a voltage acquired immediately after the starting switch 18 has been turned on, or a voltage acquired while the starting switch 18 has not been turned on and charging is not being performed. The full charge capacity (FCC) is stored in the storage unit 122 as a value determined in advance on the basis of the battery characteristics of the secondary battery unit 50. The full charge capacity (FCC) varies relative to the value (rated value) as per a new product, due to aged deterioration caused by repeating charging and discharge, and is calculated on the basis of the rated value and updated.

A method for sequentially calculating the state of charge by the current integration unit 115 and the state-of-charge calculation unit 119 is described. The current integration unit 115 integrates the charge/discharge current acquired by the current acquisition unit 112, thereby calculating an amount of change in the charge amount. When the acquisition cycle of the current by the current acquisition unit 112 is defined as $\Delta t$ (for example, 10 milliseconds), and the current value cyclically acquired is defined as Ibi (i=1, 2, ...), the amount of change in the charge amount is calculated as $\Sigma Ibi \times \Delta t (i=1, 2)$.

The state-of-charge calculation unit 119 derives SOCin on the basis of the voltage acquired by the voltage acquisition unit 111 and a conversion table storing the OCV-SOC characteristics, and stores the derived SOCin in the storage unit 122. The state-of-charge calculation unit 119 sequentially calculates an amount of change in the state of charge by dividing the amount of change in the charge/discharge amount calculated by the current integration unit 115 by the full charge capacity FCC. SOCo to be outputted is calculated by adding the amount of change in the state of charge to the stored SOCin, as indicated by the equation below. The content in of the equation below corresponds to the amount of change in the state of charge.

$$SOCo = SOCin \pm \{\Sigma Ibi \times \Delta t (i=1,2,\ldots,m)/FCC\}$$

Signs ±: + (plus) and − (minus) correspond to charging time and discharging time, respectively.

Numerical value m: the number of integrations of the charge/discharge current from when SOCin has been obtained to the present time point.

The open circuit voltage deriving unit 120 derives an open circuit voltage (OCV) of the secondary battery unit 50 on the basis of the state of charge SOCo calculated by the state-of-charge calculation unit 119, and the correspondence relationship (OCV-SOC characteristics) between the open circuit voltage and the state of charge of the secondary battery unit 50 shown in FIG. 6. The derived open circuit voltage is stored into the storage unit 122.

Figure 7:
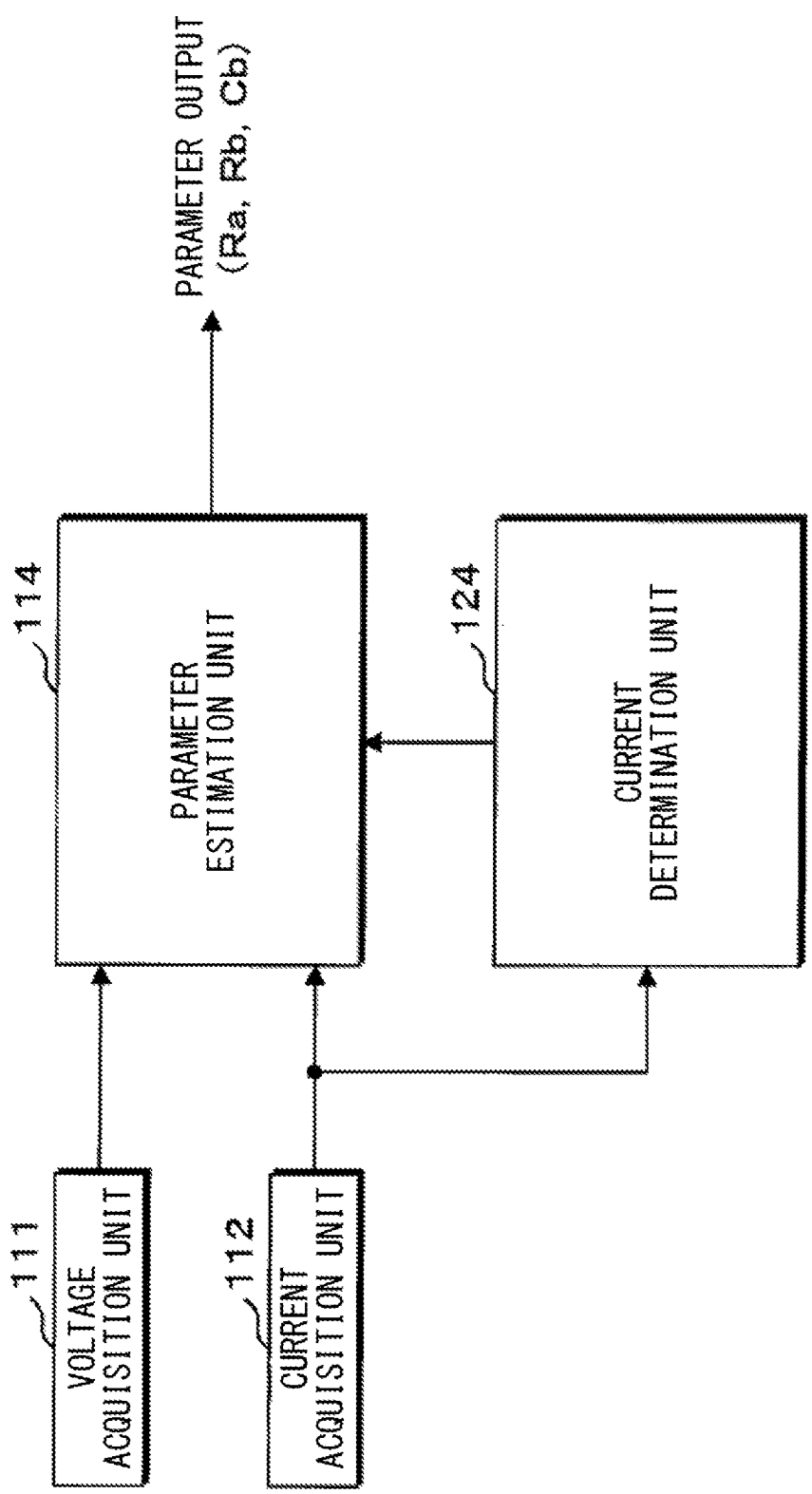
FIG. 7 is an illustration regarding inputs/outputs in a parameter estimation unit.

FIG. 7 is an illustration regarding inputs/outputs in the parameter estimation unit 114. The voltage acquired by the voltage acquisition unit 111 and the current (charge/discharge current) acquired by the current acquisition unit 112 are inputted to the parameter estimation unit 114. Further, a result of determination by the current determination unit 124 is inputted to the parameter estimation unit 114.

Similar to the parameter estimation unit 114, the current acquired by the current acquisition unit 112 is inputted to the current determination unit 124. On the basis of the inputted current, the current determination unit 124 determines whether a charge/discharge current having not less than a predetermined value of the secondary battery unit 50 is flowing. In a case where, in the charge/discharge current of the secondary battery unit 50, a positive value of the current represents charging and a negative value of the current represents discharging, the current determination unit 124 determines whether or not the absolute value of the charge/discharge current is not less than a predetermined value.

When the current determination unit 124 has determined that the absolute value of the charge/discharge current is not less than the predetermined value, the parameter estimation unit 114 estimates parameters of the secondary battery unit 50 on the basis of the inputted current and voltage of the secondary battery unit 50, and outputs the parameters.

Figure 8:
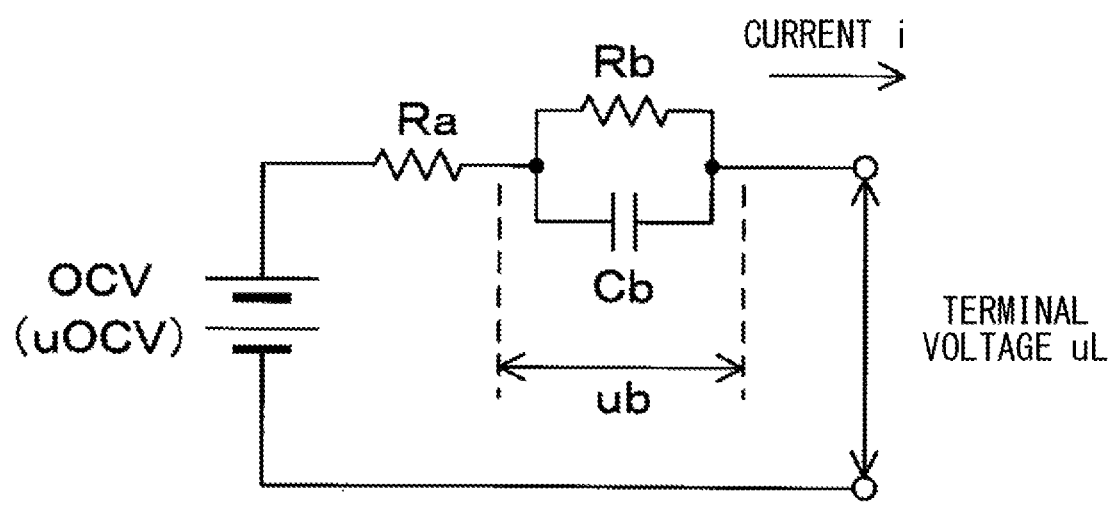
FIG. 8 illustrates an equivalent circuit model of the secondary battery unit applied in the parameter estimation unit.

FIG. 8 illustrates an equivalent circuit model of the secondary battery unit 50 applied in the parameter estimation unit 114. FIG. 8 is an equivalent circuit model of the secondary battery unit 50 according to the present embodiment. This equivalent circuit model is represented by a circuit in which a resistor Ra, and a parallel circuit of a resistor Rb and a capacitor Cb are connected in series to a voltage source having the open circuit voltage OCV as an electromotive force. The resistor Ra corresponds to the total value of the resistance of the electrolyte bulk and the interface charge transfer resistance, and represents the internal resistance not including the diffusion resistance of the secondary battery unit 50. The resistor Rb corresponds to the diffusion resistance (diffusion impedance). The capacitor Cb corresponds to the electric double layer capacitance. Parameters regarding the diffusion resistance portion include diffusion impedance and electric double layer capacitance.

A method for estimating parameters of the equivalent circuit model by the parameter estimation unit 114 is described. With respect to the parameters of the equivalent circuit model shown in FIG. 8, it is known that the following approximate equations (identification equations) (1) to (4) are established (for the details, see "Battery Management System Engineering", Shuichi Adachi et al., Tokyo Denki University Press, Chapter 6.2.2).

$$uL(k) = b0 \cdot i(k) + b1 \cdot i(k-1) - a1 \cdot uL(k-1) + (1+a1) \cdot OCV \quad (1)$$

$$b0 = Ra \quad (2)$$

$$b1 = TsRa/(RbCb) + Ts/Cb - Ra \quad (3)$$

$$a1 = Ts/(RbCb) - 1 \quad (4)$$

where
uL: acquired voltage,
i: acquired charge/discharge current
Ts: cycle for acquiring, and
k: integer indicating acquisition time point.

When the parameters Ra, Rb, and Cb are back-calculated from the above equations (2) to (4), the following equations (5) to (7) are established.

$$Ra = b0 \quad (5)$$

$$Rb = (b1 | a1b0)/(1+a1) \quad (6)$$

$$Cb = Ts/(b1 - a1b0) \quad (7)$$

In the present embodiment, using the open circuit voltage OCV derived by the open circuit voltage deriving unit 120, a recursive least squares method is applied to equation (1) into which the voltage and the charge/discharge current acquired in time series are substituted, thereby identifying the coefficients b0, b1, and a1. The identified coefficients (b0, b1, and a1) are substituted into (5), (6), and (7), to estimate an internal resistance Ra, a diffusion resistance Rb, and an electric double layer capacitance Cb. It is assumed that the open circuit voltage OCV is constant while each parameter is estimated. The estimated parameters may be corrected in accordance with the temperature acquired by the temperature acquisition unit 113.

It is also possible to estimate the parameters of the internal resistance Ra, the diffusion resistance Rb, and the electric double layer capacitance Cb, by using a Kalman filter. Specifically, an observation vector when an input signal represented by a voltage and a charge/discharge current is given to the secondary battery unit 50, and a state vector when the same input signal as above is given to the equivalent circuit model of the secondary battery unit 50 are compared with each other. The error between these vectors as the result of comparison is multiplied by the Kalman gain, and the resultant value is fed back to the equivalent circuit model, whereby correction of the equivalent circuit model is repeated such that the error between both vectors is minimized. Accordingly, the parameters are estimated.

On the basis of the internal resistance Ra of the secondary battery unit 50 estimated by the parameter estimation unit 114 and the internal resistance R1 of the secondary battery unit 50 derived by the internal resistance deriving unit 118, the update determination unit 125 determines whether or not to update the parameters (Ra, Rb, Cb) of the secondary battery unit 50 already stored in the storage unit 122. That is, on the basis of the internal resistance Ra of the secondary battery unit 50 estimated by the parameter estimation unit 114 and the internal resistance R1 of the secondary battery unit 50 derived by the internal resistance deriving unit 118, the update determination unit 125 determines whether or not to replace the parameters (Ra, Rb, Cb) of the secondary battery unit 50 already stored in the storage unit 122, with the parameters (Ra, Rb, Cb) estimated by the parameter estimation unit 114. The update determination unit 125 corresponds to a determination unit. The parameter estimation unit 114 estimates parameters (Ra, Rb, Cb) in a predetermined cycle, and the estimated parameters (Ra, Rb, Cb) are stored in a predetermined region of the storage unit 122. As for each parameter that is stored in the predetermined region of the storage unit 122, a parameter most recently estimated (latest parameter) or parameters estimated in a plurality of times in the past may be stored in an array form or the like in association with the time point of the estimation. When switching between charging and discharging has occurred in the secondary battery unit 50, the internal resistance deriving unit 118 derives an internal resistance R1. Charging and discharging of the secondary battery unit 50 are performed in accordance with the traveling state of the vehicle 1, and the deriving of the internal resistance R1 by the internal resistance deriving unit 118 is performed at a timing different from that of the parameter estimation performed by the parameter estimation unit 114.

The update determination unit 125 compares the internal resistance R1 derived by the internal resistance deriving unit 118 with the internal resistance Ra, corresponding to the internal resistance R1, among the parameters (Ra, Rb, Cb) estimated by the parameter estimation unit 114 at the time point corresponding to the time point at which the internal resistance R1 has been derived. The time point corresponding to the time point at which the internal resistance R1 has been derived is, for example, the time point at which the parameter estimation unit 114 has estimated the parameters immediately before or immediately after the time point at which the internal resistance R1 has been derived. Alternatively, the time point corresponding to the time point at which the internal resistance R1 has been derived may be an arbitrary time point between the time point at which switching between charging and discharging has occurred in the secondary battery unit 50, and the time point at which the internal resistance R1 has been derived (time point when the standby time has elapsed).

In a case where the parameter Ra estimated by the parameter estimation unit 114 is in a predetermined ratio range relative to the internal resistance R1 derived by the internal resistance deriving unit 118, i.e., in a case where the internal resistance R1 and the parameter Ra are in a predetermined ratio range, the update determination unit 125 determines to perform update (replacement) with the parameters (Ra, Rb, Cb) including the parameter Ra as the battery state quantity of the secondary battery unit 50. The parameters (Ra, Rb, Cb) with which the update (replacement) has been determined to be performed are stored in the storage unit 122 as the battery state quantity. When the internal resistance R1 and the parameter Ra are in the predetermined ratio range not less than a predetermined number of times consecutively, the update determination unit 125 may determine that update (replacement) is to be performed. In this case, when the internal resistance R1 and the parameter Ra fail to be in the predetermined ratio range not less than the predetermined number of times consecutively, the update determination unit 125 determines that update (replacement) is not to be performed.

[Math. 1]

Continuous time representation
(differential equation) of battery model $$C_b \frac{du_b}{dt} + \frac{u_b}{R_b} = i \quad (8)$$

$$u_L = u_b + iR_a + u_{ocv} \quad (9)$$

Equation (8) is a differential equation by continuous time representation in the equivalent circuit model shown in FIG. 8. Equation (9) represents the voltage (potential difference between both ends) of each portion on the circuit, with respect to the inter-terminal voltage (voltage of the secondary battery unit 50) UL in the equivalent circuit model shown in FIG. 8. The inter-terminal voltage is a total value of an open circuit voltage uOCV of the secondary battery unit 50, a voltage obtained by multiplying a charge/discharge current i by the internal resistance Ra, and a potential difference Ub between both ends of the parallel circuit formed by the resistor Rb and the capacitor Cb.

[Math. 2]

After discretization (difference equation)

$$u_b(t+1) = \left(1 - \frac{\Delta t}{R_B C_b}\right) u_b(t) + \frac{i}{C_b} \Delta t \quad (10)$$

$$U_L(t) = u_b(t) + i(t) R_a(t) + uOCV \quad (11)$$

Equation (10) is a discretized difference equation in the equivalent circuit model shown in FIG. 8. t represents the time point at which the parameters have been estimated. Equation (11) represents the voltage (potential difference between both ends) of each portion on the circuit, with respect to the inter-terminal voltage (voltage of the secondary battery unit 50) UL at each time point (t) at which the parameters in the equivalent circuit model shown in FIG. 8 have been estimated.

FIG. 9 is an illustration regarding error ratio in a predetermined range. As for the determination performed by the update determination unit 125, the predetermined ratio range in the relationship between the internal resistance R1 derived by the internal resistance deriving unit 118 and the internal resistance Ra included in the parameters estimated by the parameter estimation unit 114 is, for example, derived by being back-calculated from the required accuracy for the state of charge SOC of the secondary battery unit 50 derived in the equivalent circuit model (see FIG. 8) used by the parameter estimation unit 114. For example, the state of charge SOC is derived by calculating, using equation (11), a uOCV under a condition that each parameter (Ra, Rb, Cb) is known and the inter-terminal voltage UL can be measured, and obtaining a state of charge SOC corresponding to the uOCV on the basis of the OCV-SOC characteristics shown in FIG. 6.

The ratio (error ratio) of the internal resistance Ra included in the parameters estimated by the parameter estimation unit 114 to the internal resistance R1 derived by the internal resistance deriving unit 118 is calculated by, for example, subtracting the derived internal resistance R1 from the estimated internal resistance Ra and dividing the value obtained through the subtraction, by the internal resistance R1 (error ratio [%]=(Ra−R1)/R1)×100). For example, as shown in FIG. 9, it is assumed that the value of the internal resistance (supposed to be the true value of Ra to be estimated) of the secondary battery unit 50 as per a new product (rated value), is 0.01Ω. In a case where the requirement for the estimation accuracy of the state of charge SOC to be estimated according to the equivalent circuit model shown in FIG. 8 is ±2%, an allowable open circuit voltage OCV is derived, with the positive extreme value SOC1 being 52% (=50+2) and the negative extreme value SOC2 being 48% (=50−2) with reference to 50% of the state of charge SOC. The open circuit voltage OCV is derived with respect to the state of charge SOC, on the basis of the OCV-SOC characteristics shown in FIG. 6, for example.

An allowable range of overvoltage (i×internal resistance Ra) when 10 A of current i is caused to flow in the secondary battery unit 50 having a battery capacity of 10 Ah is calculated according to equation (11). At this time, the potential difference Ub between both ends of the parallel circuit formed by the resistor Rb and the capacitor Cb is set to 0. With respect to the calculated allowable range of the internal resistance Ra, an allowable ratio (±5%) of the internal resistance Ra to be estimated can be derived on the basis of the internal resistance (0.01Ω) serving as the true value. The allowable ratio serves as a predetermined range of the error ratio used when the update determination unit 125 determines that update (replacement) is to be performed.

By determining a predetermined range (range of allowable error ratio) to be used in determination by the update determination unit 125, on the basis of the required accuracy for the state of charge SOC derived on the basis of the parameters estimated by using the equivalent circuit model in this manner, it is possible to secure the accuracy of the determination. In the present embodiment, said predetermined range is determined on the basis of the accuracy required for the state of charge SOC, but the present embodiment is not limited thereto. Using various derived values derived on the basis of the parameters estimated by using the equivalent circuit model, the allowable error ratio range may be determined on the basis of the accuracy required for these derived values.

Figure 10:
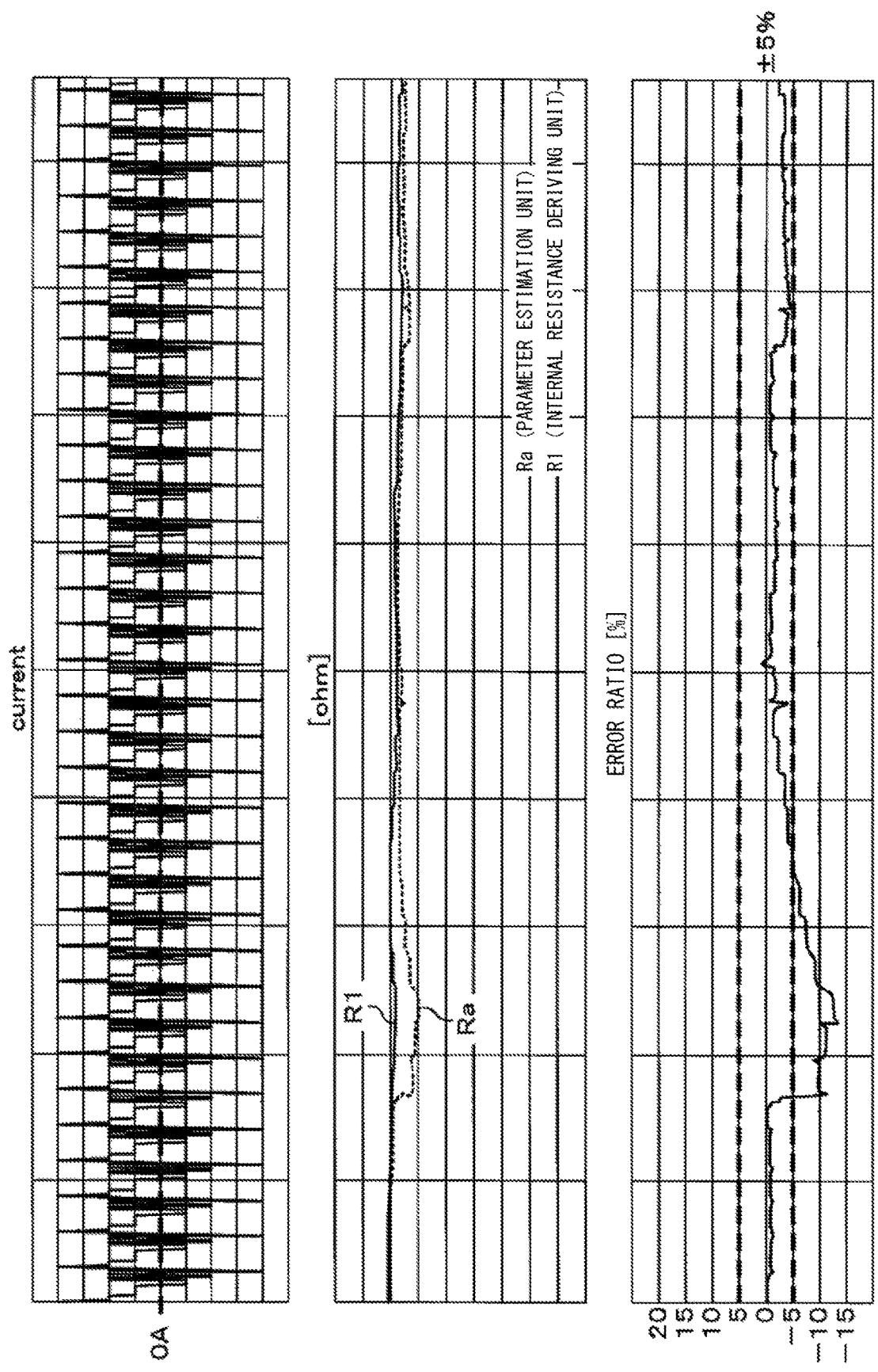
FIG. 10 is an illustration regarding a result of comparison of internal resistance (when not within a predetermined range).
Figure 11:
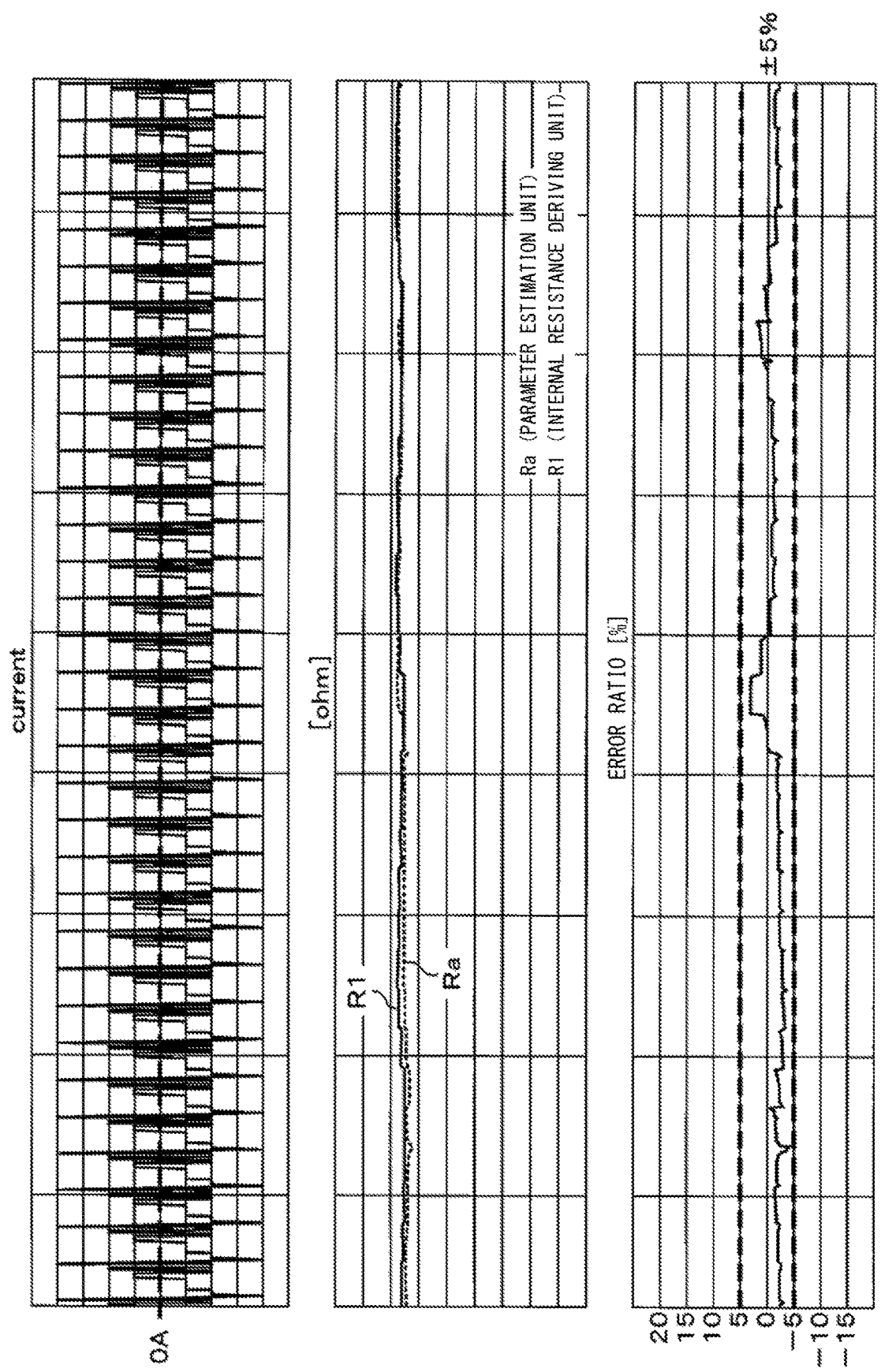
FIG. 11 is an illustration regarding a result of comparison of internal resistance (when within a predetermined range).

FIG. 10 is an illustration regarding a result of comparison of the internal resistance (when not within the predetermined range). FIG. 11 is an illustration regarding a result of comparison of the internal resistance (when within the predetermined range). In the upper diagram, the middle diagram, and the lower diagram of each of FIG. 10 and FIG. 11, the horizontal axis represents time. In the upper diagram of each of FIG. 10 and FIG. 11, the vertical axis represents current (charge/discharge current) of the secondary battery unit 50, and repeated charging and discharging are indicated in the up-down direction with respect to 0 A. In the middle diagram of each of FIG. 10 and FIG. 11, the vertical axis represents resistance value [Ω], and the internal resistance Ra estimated by the parameter estimation unit 114 and the internal resistance R1 derived by the internal resistance deriving unit 118 are shown. The lower diagram of each of FIG. 10 and FIG. 11 shows the error ratio (error ratio [%]=((Ra−R1)/R1)×100) between the internal resistance Ra and the internal resistance R1. In FIG. 10 and FIG. 11, the allowable error ratio range is set as ±5%. In FIG. 10, there are time points at which the error ratio is below −5% and outside the allowable error ratio range. In contrast, in FIG. 11, the error ratios at all time points are within the allowable error ratio range.

Figure 12:
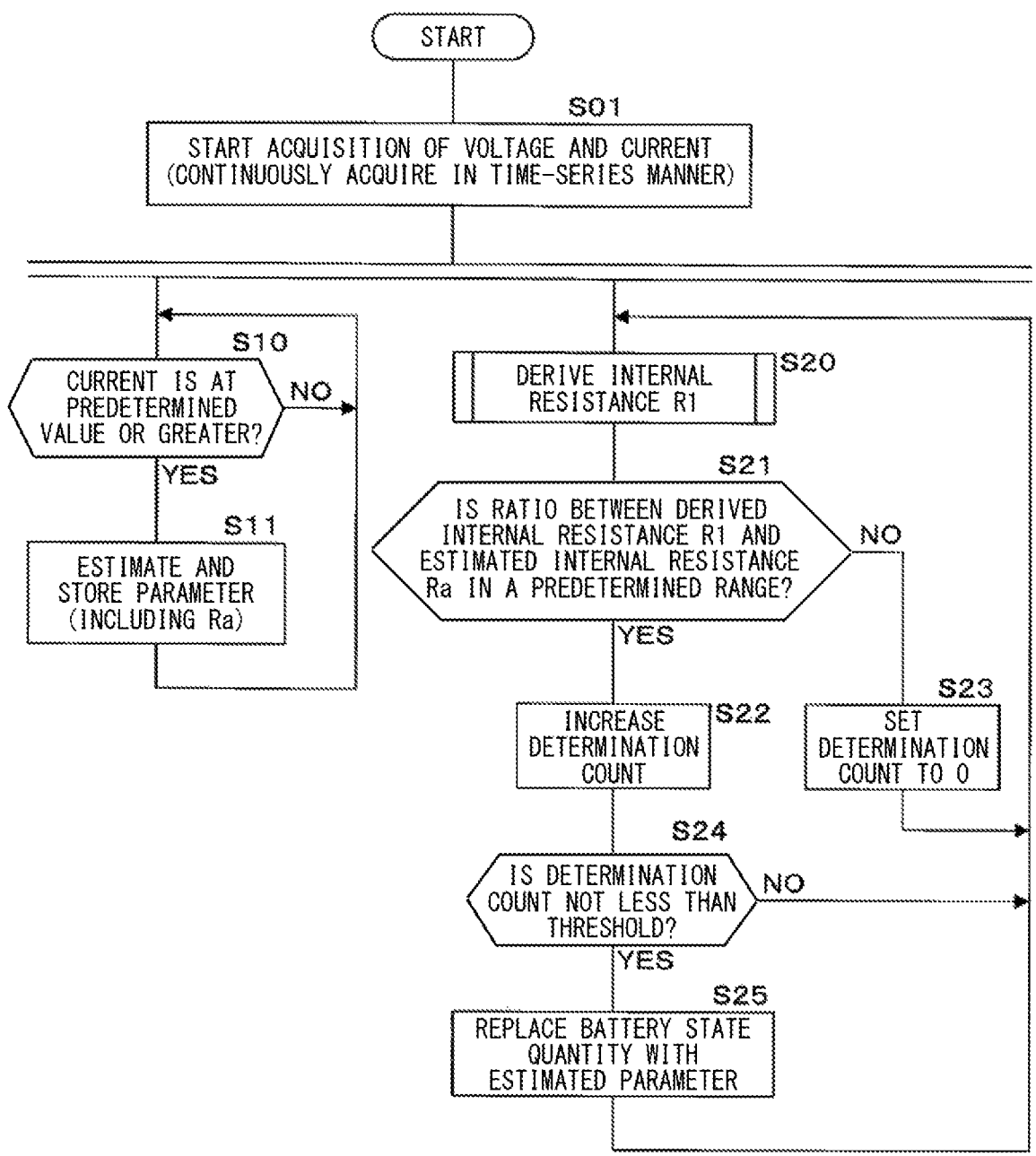
FIG. 12 is a flow chart showing an example of the procedure of a process performed by a control unit of the battery monitoring device.
Figure 13:
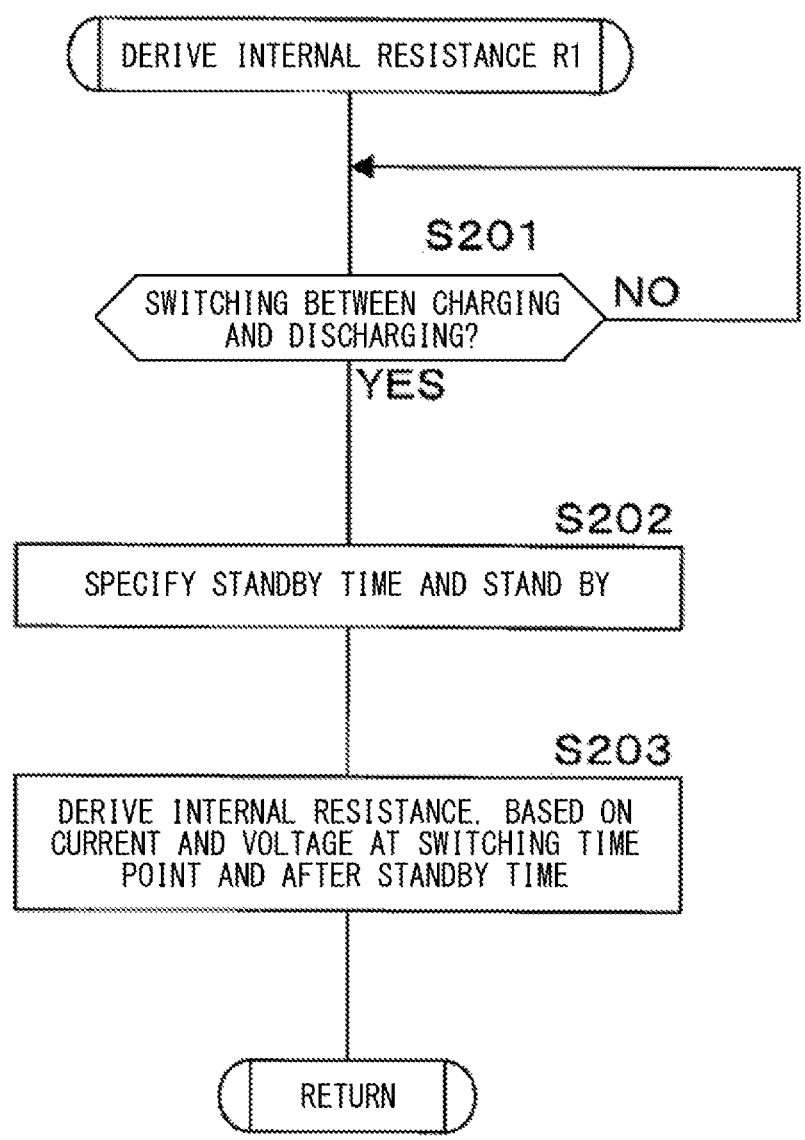
FIG. 13 is a flow chart regarding deriving of internal resistance performed by the control unit (an example of performing calculation after a lapse of standby time).

FIG. 12 is a flow chart showing an example of the procedure of a process performed by the control unit 110 of the battery monitoring device 100. FIG. 13 is a flow chart regarding deriving of the internal resistance R1 performed by the control unit (an example of performing calculation after a lapse of standby time). While the starting switch 18 is on, or while charging is being performed during stop of the vehicle, the battery monitoring device 100 operates in a normal mode, acquires a voltage and a charge/discharge current of the secondary battery unit 50 every 10 ms, for example, and acquires, at an appropriate time, a temperature of the secondary battery unit 50. Meanwhile, when the starting switch 18 is not on, and when charging is not being performed during stop of the vehicle, the battery monitoring device 100 operates in a low power consumption mode, starts every certain time period, and acquires a voltage, a charge/discharge current, and a temperature of the secondary battery unit 50, as in the case of the normal mode. The control unit 110 of the battery monitoring device 100 performs the following process on the basis of a predetermined input signal issued, for example, regularly or when the starting switch 18 is turned on.

The control unit 110 starts acquisition of a voltage and a charge/discharge current (S01). The control unit 110 acquires a voltage and a charge/discharge current of the secondary battery unit 50 detected and outputted by the voltage sensor 52 and the current sensor 53. After starting the acquisition of the voltage and the charge/discharge current, the control unit 110 continuously acquires a voltage and a charge/discharge current in a predetermined cycle, in a time-series manner. That is, also while the processes such as S10 and S20, which are executed after the process of S01 in the description of the flow chart, are being executed, the control unit 110 continuously acquires a voltage and a charge/discharge current in a predetermined cycle, in a time-series manner. The control unit 110 stores the voltage and the charge/discharge current acquired in a time-series manner, in an array form or the like into the storage unit 122 in association with time or the time point of the acquisition thereof.

After starting the acquisition of the voltage and the charge/discharge current, the control unit 110 determines whether the charge/discharge current is at a predetermined value or greater (S10). The control unit 110 derives the absolute value of the acquired charge/discharge current, compares a predetermined threshold stored in the storage unit 122, and determines whether the absolute value is the predetermined threshold or greater. When the charge/discharge current is not at the predetermined value or greater (S10: No), i.e., when the absolute value of the charge/discharge current is smaller than the predetermined threshold, the control unit 110 performs a loop process to execute the process of S10 again.

When the charge/discharge current is at the predetermined value or greater (S10: Yes), i.e., when the absolute value of the charge/discharge current is the predetermined threshold or greater, the control unit 110 estimates the parameters (Ra, Rb, Cb) of the secondary battery unit 50 (S11). By performing estimation of the parameters of the secondary battery unit 50 when charge/discharge current is at the predetermined value or greater, it is possible to accurately estimate the parameters. On the basis of a plurality of voltages and charge/discharge currents acquired in a time-series manner, the control unit 110 estimates the parameters of the secondary battery unit 50 by using an approximate equation (1) or the like corresponding to the equivalent circuit shown in, for example, FIG. 8, according to a recursive least squares method or a Kalman filter. The parameters to be estimated are the internal resistance Ra, the diffusion resistance Rb, and the electric double layer capacitance Cb. The control unit 110 stores the estimated parameters (Ra, Rb, Cb) into the storage unit 122. The control unit 110 performs the loop process to execute the process of S10 again, thereby continuing the process of estimating the parameters (Ra, Rb, Cb) in a predetermined cycle. Every time the control unit 110 estimates the parameters (Ra, Rb, Cb), the control unit 110 overwrites the parameters (Ra, Rb, Cb) estimated and stored in the previous time, and stores the latest parameters into the storage unit 122. Alternatively, the control unit 110 may store parameters estimated for a predetermined number of times in the past, delete the oldest estimated parameter when a parameter has been newly estimated, and store the newly estimated parameter, thereby storing a history of parameter estimations in the past. The control unit 110 may store each estimated parameter in association with time or the time point of the estimation of the parameter.

After starting the acquisition of the voltage and the charge/discharge current, the control unit 110 derives an internal resistance R1 (S20). The control unit 110 generates a sub-process, for example, and performs processes of S20 and thereafter in parallel with the processes of S10 and thereafter. The control unit 110 derives the internal resistance R1 according to the flow of the processes in the flow chart shown in FIG. 13.

The control unit 110 determines whether or not switching between charging and discharging has occurred (S201). On the basis of the current detected and outputted by the current sensor 53, the control unit 110 determines whether or not switching between charging and discharging of the secondary battery unit 50 has occurred. Whether or not switching between charging and discharging has occurred can be determined on the basis of the current detected and outputted by the current sensor 53 being positive or negative (direction of the current). When having determined that switching between charging and discharging has not occurred (S201: No), the control unit 110 performs a loop process to execute the process of S201 again.

When having determined that switching between charging and discharging has occurred (S201: Yes), the control unit 110 specifies a standby time and stands by (S202). On the basis of the frequency f according to an AC impedance method, the control unit 110 specifies a standby time T (T=1/(2×f)). Alternatively, the control unit 110 may correct the specified standby time T on the basis of the present state of charge SOCo of status quo, temperature, or state of health of the secondary battery unit 50. The control unit 110 stands by from the time of the switching between charging and discharging to the specified standby time.

The control unit 110 derives an internal resistance R1 on the basis of the current (charge/discharge current) and the voltage at each of the switching time point and after the standby time (S203). The control unit 110 refers to the storage unit 122, and acquires a voltage and a charge/discharge current of the secondary battery unit 50 at the time point when or immediately before the switching between charging and discharging has occurred. The control unit 110 acquires a voltage and a charge/discharge current of the secondary battery unit 50 at the time point when the standby time has elapsed. On the basis of the voltage and the charge/discharge current immediately before the switching between charging and discharging has occurred and at the time point when the standby time has elapsed, the control unit 110 derives an internal resistance R1 of the secondary battery unit 50 and stores the derived internal resistance R1 into the storage unit 122. The control unit 110 may store the internal resistance R1 in association with time or the time point at which the internal resistance R1 has been derived.

The control unit 110 determines whether the ratio (error ratio) of the estimated internal resistance Ra relative to the derived internal resistance R1 is in a predetermined range (S21). After deriving the internal resistance R1, the control unit 110 reads out, from the storage unit 122, the internal resistance Ra included in the parameters estimated in the immediately preceding time through the process of S11, for example. The control unit 110 calculates an error ratio (((Ra−R1)/R1)×100) of the estimated internal resistance Ra relative to the internal resistance R1, and determines whether or not the error ratio is in the predetermined range. The predetermined range is stored in the storage unit 122, and is ±5%, for example.

When the error ratio is in the predetermined range (S21: Yes), the control unit 110 increases a determination count (S22). The determination count is set such that the initial value is 0, for example, and the control unit 110 performs an increment process of increasing the determination count by 1 every time the process of S22 is executed. The determination count having been subjected to the increment process is stored in the storage unit 122.

The control unit 110 determines whether or not the determination count is not less than a threshold (S24). The control unit 110 refers to the threshold stored in advance in the storage unit 122, and determines whether or not the present determination count is not less than the threshold. The threshold is arbitrarily determined as, for example, 10 times on the basis of the accuracy required for estimation of parameters and the characteristics, etc., of the secondary battery unit 50. When the determination count is smaller than the threshold (S24: No), the control unit 110 performs a loop process to execute the process of S20 again.

When the determination count is not less than the threshold (S24: Yes), the control unit 110 updates the battery state quantity with the estimated parameters (S25). Then, the control unit 110 performs a loop process to execute the process of S20 again. The control unit 110 updates (replaces) the parameters (Ra, Rb, Cb) of the secondary battery unit 50 already stored as the battery state quantity in the storage unit 122, with the internal resistance Ra compared with the internal resistance R1 in the process of S21 and the parameters (Rb, Cb) estimated together with the internal resistance Ra. Thereafter, on the basis of the updated (replaced) battery state quantity, the control unit 110 performs various controls of the secondary battery unit 50, such as deriving of the state of charge SOC and the like.

When the error ratio is outside the predetermined range (S21: No), the control unit 110 sets the determination count to 0 (S23), and performs a loop process to execute the process of S20 again.

In a case where switching between charging and discharging has occurred, if the internal resistance R1 derived on the basis of a voltage and a charge/discharge current actually measured after the standby time is compared with the internal resistance Ra estimated according to the identification equation corresponding to the equivalent circuit model in, for example, FIG. 8, the accuracy of the estimated parameters (Ra, Rb, Cb) can be determined. When the error ratio of the estimated internal resistance Ra relative to the derived internal resistance R1 is in a predetermined range, if the battery state quantity of the secondary battery unit 50 is updated (replaced), it is possible to update (replace) the battery state quantity with the parameters for which a predetermined estimation accuracy is secured.

The predetermined range of the error ratio is determined on the basis of the required accuracy for the state of charge SOC of the secondary battery unit 50 derived on the basis of the parameters (Ra, Rb, Cb) estimated by using the equivalent circuit model, for example. Thus, the predetermined range can be appropriately determined.

When the determination count is not less than the threshold, i.e., the error ratio is in a predetermined range not less than the predetermined number of times consecutively, the battery state quantity is updated (replaced) with the estimated parameters (Ra, Rb, Cb). Thus, appropriateness of the update (replacement) of the battery state quantity can be improved.

In a case where switching between charging and discharging has occurred, the internal resistance R1 derived on the basis of the voltage and the charge/discharge current actually measured after the standby time can be used for deriving the state of health SOH of the secondary battery unit 50. In addition, the parameters (Ra, Rb, Cb) estimated by using the equivalent circuit model can be used for deriving the state of charge SOC of the secondary battery unit 50. Since two different methods that are used in separate usages are combined, the accuracy of the estimated parameters (Ra, Rb, Cb) can be efficiently determined, and when the battery state quantity is updated (replaced) with the parameters, the likelihoods of the parameters can be secured.

Embodiment 2

In Embodiment 1, in a case where switching between charging and discharging has occurred, deriving of the internal resistance R1 is performed on the basis of the voltage and the charge/discharge current actually measured after a standby time. However, the present disclosure is not limited thereto. The control unit 110 of the battery monitoring device 100 of Embodiment 2 is different from that of Embodiment 1 in that the internal resistance R1 is derived on the basis of a change rate of a full charge amount of the secondary battery unit 50.

While the starting switch 18 is off, the battery monitoring device 100 starts in a predetermined cycle, and the control unit 110 of the battery monitoring device 100 calculates a unit full charge capacity of each of the plurality of cells 51. "While the starting switch 18 is off" means a state where: the vehicle 1 is stopped and current application from the secondary battery unit 50 to the vehicle 1 is stopped; and the secondary battery unit 50 is performing neither charge nor discharge. "While the starting switch 18 is on" means a state where the vehicle 1 is travelling and the secondary battery unit 50 is performing charging and discharging in accordance with the traveling state of the vehicle 1.

The period from a turn-on time point (t1) of the starting switch 18 to the next turn-on time point (t3) is defined as a first trip period T1. The period from the turn-on time point (t3) of the starting switch 18 to the next turn-on time point (t5) is defined as a second trip period T2. The second trip period T2 is the next trip period following the first trip period T1. In a time period from the turn-on time point (t1) to the turn-on time point (t3), the vehicle 1 stops at a turn-off time point (t2) at which the starting switch 18 is turned off, and no current flows in the secondary battery unit 50. That is, from the turn-off time point (t2) to the turn-on time point (t3), no current flows in the secondary battery unit 50. Similarly, in a time period from the turn-on time point (t3) to the next turn-on time point (t5), the vehicle 1 stops at a turn-off time point (t4) at which the starting switch 18 is turned off, and no current flows in the secondary battery unit 50. That is, from the turn-off time point (t4) to the turn-on time point (t5), no current flows in the secondary battery unit 50.

The control unit 110 calculates a state of charge (a first state of charge) of each of the plurality of cells 51 from the turn-off time point (t2) to the turn-on time point (t3) in the first trip period T1. Similarly, the control unit 110 calculates a state of charge (a second state of charge) of each of the plurality of cells 51 from the turn-off time point (t4) to the turn-on time point (t5) in the second trip period T2.

In the periods from the turn-off time point (t2) to the turn-on time point (t3) and from the turn-off time point (t4) to the turn-on time point (t5), no current flows in the secondary battery unit 50. Thus, a first voltage (from t2 to t3) and a second voltage (from t4 to t5) acquired by the voltage acquisition unit 111 in the respective periods each correspond to an open circuit voltage. On the basis of the OCV-SOC characteristics shown in FIG. 6, the control unit 110 derives a first state of charge SOC1 and a second state of charge SOC2 on the basis of the first voltage and the second voltage. The control unit 110 (the current integration unit 115) calculates a charge/discharge amount ΔC of the secondary battery unit 50 on the basis of the charge/discharge current from the time point of the acquisition of the first voltage to the time point of the acquisition of the second voltage.

The control unit 110 derives a unit full charge capacity F on the basis of the charge/discharge amount ΔC, the first state of charge SOC1, and the second state of charge SOC2. The unit full charge capacity F can be derived by dividing the charge/discharge amount ΔC by the difference between the second state of charge SOC2 and the first state of charge SOC1 (F=ΔC/(SOC2−SOC1)). On the basis of the unit full charge capacity F, the control unit 110 derives a full charge capacity FCC of the secondary battery unit 50. For example, the full charge capacity FCC can be derived by totaling the unit full charge capacity F of each cell 51.

Figure 14:
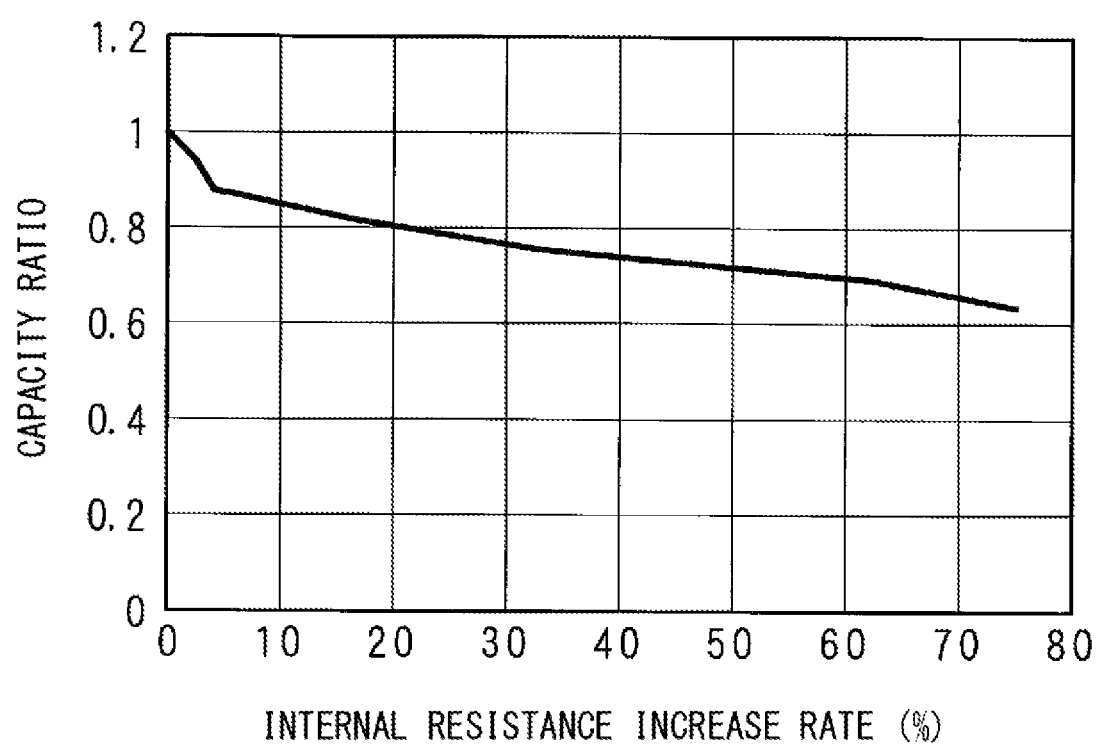
FIG. 14 illustrates the correspondence between full charge capacity and internal resistance of the secondary battery unit.

FIG. 14 illustrates the correspondence between the full charge capacity and the internal resistance R1 of the secondary battery unit 50. In FIG. 14, the vertical axis represents the ratio (capacity ratio) of the full charge capacity of the secondary battery unit 50, and the horizontal axis represents the increase rate of the internal resistance R1 of the secondary battery unit 50. The ratio of the full charge capacity is the ratio of the full charge capacity FCC derived as described above to the full charge capacity (rated value) of the secondary battery unit 50 as per a new product. The increase rate of the internal resistance R1 is the ratio of the internal resistance R1 derived from the capacity ratio to an internal resistance R0 (rated value) of the secondary battery unit 50 as per a new product. As shown in FIG. 14, when the capacity ratio decreases, the internal resistance R1 increases. The capacity ratio and the increase rate of the internal resistance R1 shown in FIG. 14 have been normalized, with the state of charge SOC being 50% and the temperature of the secondary battery unit 50 being 25° C., for example.

FIG. 15 illustrates conversion ratio of the internal resistance R1 based on state of charge and temperature. In FIG. 15, the vertical item indicates the temperature of the secondary battery unit 50, and the horizontal item indicates the state of charge SOC. FIG. 15 is a matrix representation based on the temperature and the state of charge SOC of the secondary battery unit 50, and shows a correction coefficient of the internal resistance R1 derived on the basis of FIG. 14, so as to correspond to each combination of a temperature and a state of charge SOC. The values shown in FIG. 14 and FIG. 15 are stored in the storage unit 122.

Figure 16:
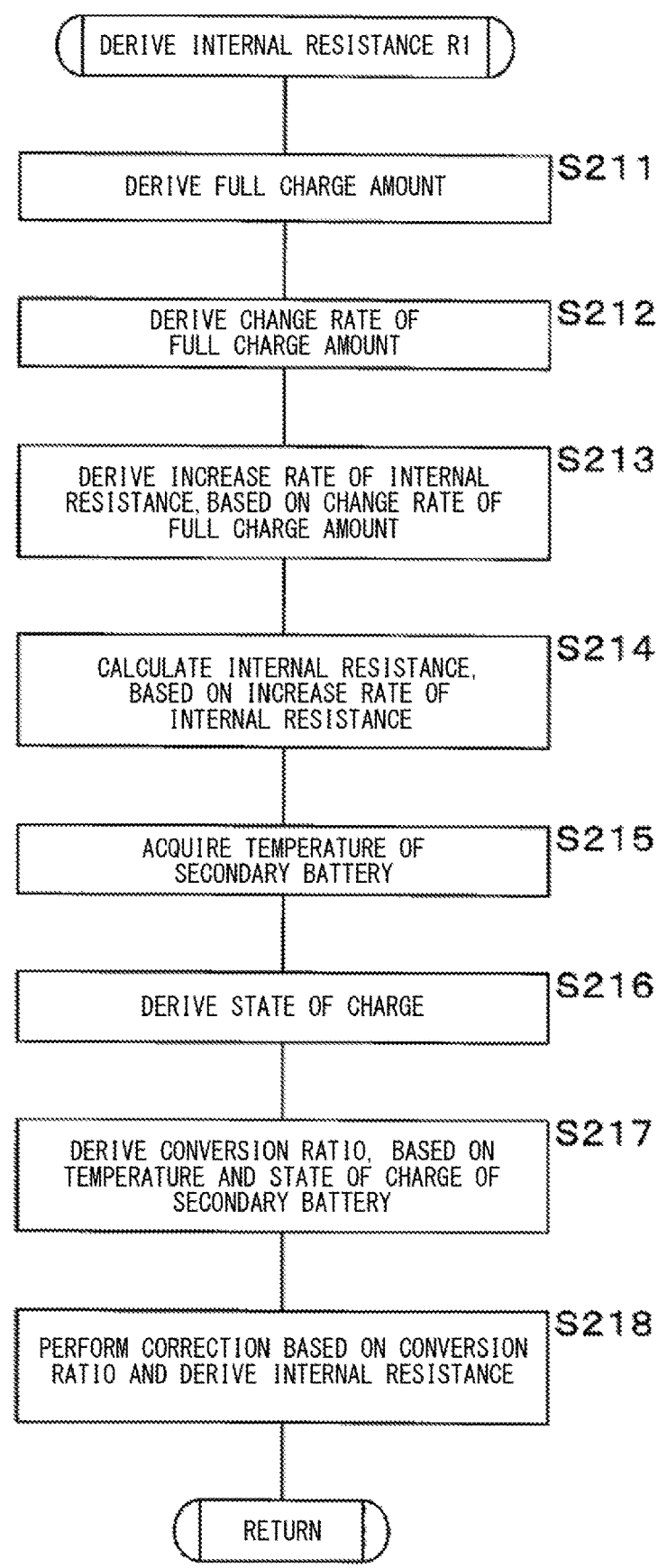
FIG. 16 is a flow chart regarding deriving of internal resistance performed by the control unit (an example of performing deriving on the basis of full charge capacity).

FIG. 16 is a flow chart regarding deriving of the internal resistance R1 performed by the control unit (an example of performing deriving on the basis of full charge capacity). Similar to Embodiment 1, the control unit 110 of the battery monitoring device 100 of Embodiment 2 performs the process described in the flow chart in FIG. 12, on the basis of a predetermined input signal issued, for example, regularly or when the starting switch 18 is turned on.

Similar to Embodiment 1, the control unit 110 of Embodiment 2 performs the processes of S01, S10, and S11 in the flow chart shown in FIG. 12. In Embodiment 2, the process of S20 in the flow chart shown in FIG. 12 is different from that in Embodiment 1. The control unit 110 of Embodiment 2 derives the internal resistance R1 according to the flow of the processes in the flow chart shown in FIG. 16.

The control unit 110 derives a full charge capacity FCC (S211). As described above, the control unit 110 derives the full charge capacity FCC of the secondary battery unit 50 on the basis of the unit full charge capacity F.

The control unit 110 derives a change rate of the full charge capacity FCC (S212). The control unit 110 divides the derived full charge capacity FCC by a full charge capacity (rated value), of the secondary battery unit 50 as per a new product, stored in the storage unit 122 in advance, thereby deriving a capacity ratio, i.e., the change rate of the full charge capacity compared with that of a new product.

The control unit 110 derives an increase rate of the internal resistance R1 on the basis of the change rate of the full charge capacity FCC (S213). On the basis of the relationship between the capacity ratio and the increase rate of the internal resistance R1 shown in, for example, FIG. 14, the control unit 110 derives an increase rate of the internal resistance R1 that corresponds to the change rate (capacity ratio) of the derived full charge capacity FCC.

The control unit 110 calculates an internal resistance R1 on the basis of the increase rate of the internal resistance R1 (S214). The control unit 110 reads out the internal resistance R0 (rated value) of the secondary battery unit 50 as per a new product stored in the storage unit 122, multiplies the internal resistance R0 as per the new product by the derived increase rate, and derives a normalized internal resistance R1 of the present time point. As shown in FIG. 14, when the increase rate of the internal resistance R1 is 20% (capacity ratio=0.8), if the internal resistance R0 (rated value) as per the new product is 0.01Ω, the normalized internal resistance R1 at the present time point is 0.012Ω (0.01×(100+20)/100).

The control unit 110 acquires a temperature of the secondary battery unit 50 (S215). The control unit 110 acquires the temperature of the secondary battery unit 50 outputted from the temperature sensor 54, and stores the temperature into the storage unit 122. The control unit 110 derives a state of charge SOC of the secondary battery unit 50 (S216).

On the basis of the temperature and the state of charge SOC of the secondary battery unit 50, the control unit 110 derives a conversion ratio (S217). The control unit 110 refers to the storage unit 122, and derives a conversion ratio (correction coefficient) determined in accordance with the relationship between the temperature and the state of charge SOC of the secondary battery unit 50 as shown in, for example, FIG. 15. As shown in FIG. 15, for example, when the temperature is 10° C. and the state of charge SOC is 90%, the conversion ratio is 1.5.

The control unit 110 performs correction on the basis of the conversion ratio, and derives an internal resistance R1 (S218). The control unit 110 multiplies the normalized internal resistance R1 derived in S214, by the conversion ratio (correction coefficient) derived in S217 (normalized internal resistance R1×conversion ratio), thereby deriving an internal resistance R1 that corresponds to the temperature and the state of charge SOC of the secondary battery unit 50 at the present time point.

Similar to Embodiment 1, the control unit 110 performs processes of S21 to S25 in the flow chart shown in FIG. 12.

Since there is correlation between the internal resistance R1 and the full charge capacity of the secondary battery unit 50, the internal resistance R1 can be efficiently derived by using the correlation. When the internal resistance R1 derived by using the correlation is compared with the internal resistance Ra included in the estimated parameters (Ra, Rb, Cb), and the error ratio is in a predetermined range, it is determined that the battery state quantity is to be updated (replaced) with the estimated parameters. Therefore, when updating (replacing) the battery state quantity with the estimated parameters, the likelihoods of the parameters can be secured.

Modification

In Embodiment 1 and Embodiment 2, the control unit 110 generates a sub-process, for example, and derives the internal resistance R1 in parallel with the processes of parameter estimation (S10, S11). However, the present disclosure is not limited thereto. The deriving of the internal resistance R1 may be performed by a microcomputer, etc. (not shown), including a CPU other than the CPU of the control unit 110 that performs parameter estimation. In this case, the control unit 110 and the microcomputer are communicably connected to each other. The control unit 110 may acquire the internal resistance R1 derived by the microcomputer, and compare the acquired internal resistance R1 with the internal resistance Ra included in the estimated parameters, thereby determining whether or not to perform update (replacement) with the estimated parameters as the battery state quantity of the secondary battery unit 50.

The disclosed embodiments are all illustrative in all aspects and should not be recognized as being restrictive. The scope of the present disclosure is defined by the scope of the claims rather than the above-described meaning, and is intended to include meaning equivalent to the scope of the claims and all modifications within the scope.

REFERENCE SIGNS LIST

1 vehicle
11 relay
12 relay
13 inverter
14 motor
15 DC/DC converter
16 battery
17 electric load
18 starting switch
19 charger
50 secondary battery unit
50a voltage detection line
50b current detection line
50c temperature detection line
51 cell
52 voltage sensor
53 current sensor
54 temperature sensor
100 battery monitoring device
110 control unit
111 voltage acquisition unit
112 current acquisition unit
113 temperature acquisition unit
114 parameter estimation unit
115 current integration unit
116 switching determination unit
117 standby time specification unit
118 internal resistance deriving unit
119 state-of-charge calculation unit
120 open circuit voltage deriving unit
121 timer
122 storage unit
122P program
123 storage medium
124 current determination unit
125 update determination unit (determination unit)

The invention claimed is:

1. A secondary battery control system comprising:
a secondary battery including a plurality of cells, a voltage sensor, and a current sensor; and
a secondary battery parameter estimation device including
a memory that stores a plurality of parameters of the secondary battery, and
a processor, wherein
the voltage sensor is configured to detect a voltage of the secondary battery,
the current sensor is configured to detect a current of the secondary battery, and
the processor is programmed to:
acquire the voltage of the secondary battery detected by the voltage sensor;
acquire the current of the secondary battery detected by the current sensor;
estimate, using a first method, the plurality of parameters including a first internal resistance of the secondary battery in an equivalent circuit model corresponding to the secondary battery, on the basis of the acquired voltage and the acquired current;
derive a second internal resistance of the secondary battery using a second method different from the first method;
make a determination, on the basis of a result of comparison between the first internal resistance estimated using the first method and the second internal resistance derived using the second method, whether or not to update the memory by replacing the plurality of parameters of the secondary battery stored in the memory with the plurality of parameters estimated using the first method;
in response to the determination indicating to update the memory, replace the plurality of parameters of the secondary battery stored in the memory with the plurality of parameters estimated using the first method, and
perform control of the secondary battery based on the plurality of parameters stored in the updated memory.

2. The secondary battery control system according to claim 1, wherein
the processor is further programmed to determine whether or not switching between charging and discharging of the secondary battery has occurred, and
when the processor has determined that the switching has occurred, the processor derives the second internal resistance of the secondary battery on the basis of the acquired voltage and the acquired current after a predetermined standby time.

3. The secondary battery control system according to claim 1, wherein
the processor derives the second internal resistance of the secondary battery on the basis of at least one of a full charge capacity, a state of charge, and a temperature of the secondary battery.

4. The secondary battery control system according to claim 1, wherein
when a ratio between the second internal resistance and the first internal resistance is in a predetermined range, the processor determines to replace the plurality of parameters of the secondary battery stored in the memory with the plurality of parameters estimated using the first method.

5. The secondary battery control system according to claim 4, wherein
the predetermined range is determined in accordance with a required accuracy for a state of charge of the secondary battery derived on the basis of the plurality of parameters estimated using the first method.

6. The secondary battery control system according to claim 1, wherein the processor estimates the plurality of parameters including the first internal resistance of the secondary battery using the first method a plurality of times, the processor derives the second internal resistance of the secondary battery using the second method a plurality of times, and the processor makes the determination whether or not to update the memory by replacing the plurality of parameters of the secondary battery stored in the memory with the plurality of parameters estimated using the first method, on the basis of a result of comparison between each second internal resistance, derived using the second method, and each first internal resistance, estimated using the first method, corresponding to each time point at which the second internal resistance has been derived.

7. The secondary battery control system according to claim 6, wherein when a ratio between the second internal resistance and the corresponding first internal resistance is in a predetermined range not less than a predetermined number of times consecutively in the results of the comparisons, the processor determines to replace the plurality of parameters of the secondary battery stored in the memory with the plurality of parameters estimated using the first method.

8. The secondary battery control system according to claim 1, wherein a battery state quantity of the secondary battery includes the plurality of parameters estimated using the first method, and the processor makes the determination whether or not to update the memory with the plurality of parameters estimated using the first method, as the battery state quantity of the secondary battery.

9. A secondary battery control method for a secondary battery control system comprising (i) a secondary battery including a plurality of cells, a voltage sensor, and a current sensor, and (ii) a secondary battery parameter estimation device including a memory that stores a plurality of parameters of the secondary battery and a processor, the method comprising:

detecting a voltage of the secondary battery and a current of the secondary battery using the voltage sensor and the current sensor respectively;

acquiring the voltage of the secondary battery detected by the voltage sensor and the current of the secondary battery detected by the current sensor;

estimating, using a first method, and on the basis of the acquired voltage and the acquired current, the plurality of parameters including a first internal resistance of the secondary battery in an equivalent circuit model corresponding to the secondary battery;

deriving a second internal resistance of the secondary battery using a second method different from the first method;

making a determination, on the basis of a result of comparison between the first internal resistance estimated using the first method and the second internal resistance derived using the second method, whether or not to update the memory by replacing the plurality of parameters of the secondary battery stored in the memory with the plurality of parameters estimated using the first method;

in response to the determination indicating to update the memory, replacing the plurality of parameters of the secondary battery stored in the memory with the plurality of parameters estimated using the first method; and performing control of the secondary battery based on the plurality of parameters stored in the updated memory.

* * * * *